US007368306B2

(12) United States Patent
Ohnuma et al.

(10) Patent No.: US 7,368,306 B2
(45) Date of Patent: May 6, 2008

(54) FIELD EMISSION DEVICE AND MANUFACTURING METHOD THEREOF

(75) Inventors: Hideto Ohnuma, Kanagawa (JP); Yukie Nemoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 76 days.

(21) Appl. No.: 11/347,283

(22) Filed: Feb. 6, 2006

(65) Prior Publication Data

US 2006/0141657 A1 Jun. 29, 2006

Related U.S. Application Data

(62) Division of application No. 10/739,155, filed on Dec. 19, 2003, now Pat. No. 7,015,496.

(30) Foreign Application Priority Data

Dec. 27, 2002 (JP) ............................ 2002-379977
Dec. 27, 2002 (JP) ............................ 2002-380101

(51) Int. Cl.
*H01L 21/00* (2006.01)

(52) U.S. Cl. ................................ 438/20; 257/E21.001

(58) Field of Classification Search .................. 438/20; 257/E21.001
See application file for complete search history.

(56) References Cited

U.S. PATENT DOCUMENTS

| | | | |
|---|---|---|---|
| 5,266,530 | A | 11/1993 | Bagley et al. |
| 5,550,435 | A | 8/1996 | Kuriyama et al. |
| 5,643,826 | A | 7/1997 | Ohtani et al. |
| 5,688,707 | A | 11/1997 | Lee et al. |
| 5,786,659 | A | 7/1998 | Takagi et al. |
| 5,886,459 | A | 3/1999 | Auciello et al. |
| 5,923,962 | A | 7/1999 | Ohtani et al. |
| 6,285,042 | B1 | 9/2001 | Ohtani et al. |
| 6,326,221 | B1 | 12/2001 | Lee et al. |
| 2001/0010391 | A1 | 8/2001 | Nakajima et al. |
| 2002/0187594 | A1 | 12/2002 | Yamazaki et al. |

FOREIGN PATENT DOCUMENTS

| | | |
|---|---|---|
| JP | 09-102269 | 4/1997 |
| JP | 11-102637 | 4/1999 |
| JP | 2002-175764 | 6/2002 |
| WO | WO 03/015117 A1 * | 2/2003 |

* cited by examiner

*Primary Examiner*—Lex Malsawma
(74) *Attorney, Agent, or Firm*—Nixon Peabody LLP; Jeffrey L. Costellia

(57) ABSTRACT

It is an object to provide techniques for forming a field emission device of a field emission display device with the use of an inexpensive large-sized substrate according to the process that enables improving productivity.

A field emission device according to the present invention includes a cathode electrode formed on an insulating surface of a substrate and a convex electron emission portion formed at a surface of the cathode electrode, and the cathode electrode and the electron emission portion include the same semiconductor film. The electron emission portion has a conical shape or a whiskers shape.

20 Claims, 28 Drawing Sheets

FIELD EMISSION DEVICE AND MANUFACTURING METHOD THEREOF

BACKGROUND OF THE INVENTION

1. Field of the Invention

The present invention relates to a field emission device and a method for manufacturing of the field emission device, and also relates to a field emission display device including the field emission device.

2. Description of the Related Arts

These days, a flat type (flat panel type) display device has been studied as an image display device by which a cathode-ray tube (CRT) is replaced. As such flat type display device, a liquid crystal display device (LCD), an electroluminescence display device (ELD), and a plasma display device (PDP) can be given. In addition, a display device that utilizes an electron emitted due to electric field effect to emit light with electron beam exciting, a so-called field emission display device (FED: field emission display, is suggested to which attention is paid from the view point of a high performance for displaying a moving image.

The FED has a first substrate with a cathode electrode and a second substrate with an anode electrode to which a phosphor layer is put, which are arranged to face each other and are bonded with a sealing member, and the space enclosed by the first and second substrates and the sealing member is kept high vacuum. An electron emitted from the cathode electrode is moved through the enclosed space to excite the phosphor layer put to the anode electrode, and then light is emitted to obtain an image display.

The FED can be classified in a diode-type, a triode-type, or a tetrode-type by electrode. In the case of a diode-type FED, a stripe-shaped cathode electrode is formed on a surface of a first substrate and a stripe-shaped anode electrode is formed on a surface of a second substrate, and the cathode electrode is orthogonal to the anode electrode at a distance from several μm to several mm. At the intersection of the cathode electrode and the anode electrode through vacuum, voltage up to 10 kV is applied to emit an electron between the cathode electrode and the anode electrode. The electron is made to get to a phosphor layer put to the anode electrode to excite the phosphor, and then light is emitted to display an image.

In the case of a triode-type FED, over a cathode electrode formed on a first substrate, a gate electrode that is orthogonal to the cathode electrode is formed through an insulating film. The cathode electrodes and the gate electrode have a stripe shape or a matrix shape, and an electron emission portion (electron emitter) as an electron source is formed at the intersecting portion thereof through the insulating film. An electron is emitted from the electron emission portion by applying voltage to each of the cathode electrode and the gate electrode. The electron is attracted to an anode electrode of a second substrate, to which higher voltage is applied than to the gate electrode, to excite a phosphor layer put to the anode electrode, and then light is emitted to display an image.

In the case of a tetrode-type FED, a plate-shaped or filmy convergence electrode, which has an opening portion with respect to each dot, is formed between a gate electrode and an anode electrode of a triode-type FED. With the convergence electrode provided, an electron emitted from an electron emission portion is converged with respect to each dot to excite a phosphor layer put to an anode electrode, and then light is emitted to display an image.

A field emission device has an electron emission portion that emits an electron, which is formed on a cathode electrode. The field emission device may have a gate electrode over the cathode electrode through an insulating film. Now, as the field emission device of a field emission display device, various structures are proposed. Specifically, there are a spint-type field emission device, a surface-type field emission device, an edge-type field emission device, and MIM (Metal-Insulator-Metal).

The spint-type field emission device is a field emission device that has a conical electron emission portion formed on a cathode electrode. It is possible to give such advantages that 1) the electron drawing efficiency is high since the electron emission portion is arranged in the vicinity of the center of the gate electrode, where the electric field is most concentrated, 2) it is possible to draw a pattern of an arrangement of the field emission device with accuracy to make it easy to optimize an arrangement of distribution of electric field, and in-plane uniformity of drawn current is high 3) the directivity of electron emission is regular, compared to the other field emission device.

As conventional spint-type field emission device, there are a conical field emission device formed by evaporation of metal (page 11 and FIGS. 9A to 10 C of Japanese Patent Laid-Open 2002-175764) and a conical field emission device formed with the use of MOSFET (page 3 to 4 and FIG. 1 of Japanese Patent Laid-Open Hei 11-102637).

A manufacturing process of the field emission device disclosed in Japanese Patent Laid-Open 2002-175764 will be shown with reference to FIGS. 28A to 28D. As shown in FIG. 28A, an interlayer insulating film 1103 and a gate electrode 1104 are formed on a stripe-shaped cathode electrode 1102 formed on a glass substrate 1101.

Next, as shown in FIG. 28B, the gate electrode 1104 and the interlayer insulating film 1103 are etched to form an opening portion 1105. Then, oblique evaporation of aluminum is performed with respect to the gate electrode to form a peeling layer 1106 protruding from an open end of the gate electrode in an appentice shape.

Next, as shown in FIG. 28C, evaporation of metal such as molybdenum is performed vertically to the whole substrate. Since a metal layer 1107 is deposited on the appentice-shaped peeling layer 1106 and the opening portion 1105 become reduced in size, metal to be deposited on a basal plane of the opening portion 1105, that is, on the cathode electrode 1102, is gradually limited to metal passing in the vicinity of the center of the opening portion 1105. Hereby, a conical deposit 1108 is formed on the basal plane to become an electron emission portion.

Next, as shown in FIG. 28D, wet etching to the interlayer insulating film 1103 below the gate electrode 1104 is performed to form a shape 1109 of the gate electrode protruding from an upper portion of the interlayer insulating layer.

However, it is difficult to form an appentice-shaped peeling layer in a uniform size by oblique evaporation, some kind of in-plane variation or lot-to-lot variation is unavoidable. In addition, there are also problems that a large-sized evaporation system is needed, throughput is lowered, the residue in removing a peeling layer formed on a large area causes contamination of a cathode electrode or a field emission device to lower yield of manufacturing a display device.

On the other hand, the field emission device disclosed in Japanese Patent Laid-Open Hei 11-102637 uses MOSFET, and a semiconductor substrate is used. Therefore, the size of the substrate is limited, and there is a problem that mass production is difficult to lower throughput.

SUMMARY OF THE INVENTION

In view of the above problems, it is an object of the present invention to form a field emission device with the use of an inexpensive large-sized substrate according to the process that enables improving productivity.

According to the present invention, a semiconductor film is formed on an insulating surface of a substrate, and a first process is conducted to the semiconductor film to form a crystalline semiconductor film with a convex portion. It is the first process to irradiate a laser beam to the semiconductor film, or to add a metal element to the semiconductor film, make the metal element separate out at a grain boundary of the semiconductor film, and heat in an atmosphere including a semiconductor element element.

According to the present invention, a pulse oscillation laser beam is irradiated to a semiconductor film formed on an insulating surface of a substrate to form an electron emission portion (electron emitter) of a field emission device. The electron emission portion formed according to the present invention is formed on a surface of a cathode electrode of the field emission device, and the cathode electrode and the electron emission portion include the same semiconductor film. The electron emission portion according to the process of the irradiation of the pulse oscillation laser beam has a conical shape. Besides, the pulse oscillation laser beam that can be used in the present invention has a wavelength from 100 to 600 nm, and the conditions in irradiating the laser beam have a laser beam energy density from 300 to 700 $mJ/cm^2$ and an irradiated pulse frequency from 30 to 400 times.

Alternatively, according to the present invention, a metal element is added to a semiconductor film formed on an insulating surface of a substrate, the metal element is aggregated at a grain boundary of the semiconductor film, and heat treatment is performed in an atmosphere including a semiconductor element to form an electron emission portion (electron emitter) of a field emission device. The electron emission portion formed according to the present invention is formed on a surface of a cathode electrode of the field emission device, and the cathode electrode and the electron emission portion include the same semiconductor film. The electron emission portion according to the process of the irradiation of the pulse oscillation laser beam has a whiskers shape. The whiskers shape is namely a shape of an aggregate of acerous or very fine fiber.

As the process for aggregating the metal element at the grain boundary of the semiconductor film according to the present invention, heating (thermal annealing) and laser irradiation (laser crystallization) can be given. As the means for adding the metal element to the semiconductor film, application, sputtering, and CVD can be given.

A field a manufacturing method of the field emission device according to the present invention, based on such conception of the present invention, can include any of structures shown below.

A field emission device according to the present invention includes a cathode electrode formed over an insulating surface of a substrate and a convex electron emission portion (convex electron emitter) formed at a surface of the cathode electrode, and the cathode electrode and the electron emission portion include the same crystalline semiconductor film. The electron emission portion has a conical shape or a whiskers shape. The cathode electrode may have a planar shape or a stripe shape.

Further, a field emission device according to the present invention includes a stripe-shaped cathode electrode formed over an insulating surface of a substrate, an insulating film formed on the cathode electrode and the insulating surface, a gate electrode formed on the insulating film, an opening portion through the gate electrode and the insulating film for exposing the cathode electrode, and a convex electron emission portion formed in the opening portion on the cathode electrode, and the cathode electrode and the electron emission portion include the same crystalline semiconductor film. The electron emission portion has a conical shape or a whiskers shape. The semiconductor film has n-type conductivity.

Furthermore, a field emission device according to the present invention includes a strip-shaped source wiring formed over an insulating surface of a substrate, a crystalline semiconductor film including a source region and a drain region, an insulating film formed on the crystalline semiconductor film, a gate electrode formed on the insulating film, an opening portion through the gate electrode and the insulating film for exposing the crystalline semiconductor film, and a convex electron emission portion formed in the opening portion on the drain region, the electron emission portion and the drain region include the same crystalline semiconductor film and the source wiring has contact with the source region. The electron emission portion has a conical shape or a whiskers shape. The source and drain regions of the semiconductor film has n-type conductivity. In addition, the source wiring intersects with the gate electrode through the insulating film.

In a method for manufacturing a field emission device, according to the present invention, a semiconductor film is formed over an insulating surface of a substrate, and a laser beam is irradiated to the semiconductor film to form a conical convex portion (electron emission portion). Alternatively, a semiconductor film in the shape of a stripe may be formed over an insulating surface of a substrate before a laser beam is irradiated to the semiconductor film to form a conical convex portion (electron emission portion).

Further, in a method for manufacturing a field emission device, according to the present invention, a semiconductor film in the shape of a stripe is formed over an insulating surface of a substrate, an insulating film is formed on the semiconductor film and the insulating surface, a gate electrode in the shape of a stripe is formed on the insulating film, a portion of the gate electrode and a portion of the insulating film are removed to expose the semiconductor film, and a laser beam is irradiated to the semiconductor film to form a conical convex portion (electron emission portion). The semiconductor film is doped with an impurity that imparts n-type.

Further, in a method for manufacturing a field emission device, according to the present invention, a first conductive film in the shape of a stripe is formed over an insulating surface of a substrate, a first insulating film is formed on the insulating surface, a semiconductor film is formed on the first conductive film and the first insulating film, the semiconductor film is etched into a desired shape, a second insulating film is formed on the semiconductor film in the desired shape, a second conductive film is formed on the second insulating film, a portion of the second conductive film and a portion of the second insulating film are removed to expose the semiconductor film, and a laser beam is irradiated to the semiconductor film to form a conical convex portion (electron emission portion).

Furthermore, in a method for manufacturing a field emission device, according to the present invention, a semiconductor film is formed over an insulating surface of a substrate, the semiconductor film is etched into a desired shape, a first insulating film is formed on the semiconductor film in the desired shape, a first conductive film is formed on the first insulating film, a second insulating film is formed on the first conductive film and the first insulating film, a portion of the first insulating film and a portion of the second insulating film are removed to expose first and second portions of the semiconductor film, a second conductive film (source electrode) is formed to have contact with the first portion, and a laser beam is irradiated to the semiconductor film to form a conical convex portion (electron emission portion) in the second portion.

After the semiconductor film is etched into the desired shape, a portion of the semiconductor film in the desired shape is doped with an impurity that imparts n-type to form source and drain regions.

In addition, the laser beam is a pulse oscillation laser beam with a wavelength from 100 to 600 nm, and the laser beam has an energy density form 300 to 700 mJ/cm$^2$ and an irradiated pulse frequency from 30 to 400 times. It is preferable that an atmosphere in irradiating the laser beam includes 1% or more oxygen.

The semiconductor film used for the electron emission portion according to the present invention includes silicon, and silicon-germanium ($Si_{1-x}Ge_x$:0<x<1, typically, x=0.001 to 0.05) may be used.

Besides, in a method for manufacturing a field emission device, according to the present invention, a semiconductor film is formed over an insulating surface of a substrate, a metal element is added to the semiconductor film, a first process is performed to crystallize the semiconductor film and segregate the metal element or metal silicide at a grain boundary of the crystallized semiconductor film, a second process is performed in an atmosphere including gas including a semiconductor element to form a whiskers-shaped electron emission portion at (in the vicinity of) a surface of the metal element or the metal silicide.

The metal element is added with one of application, PVD, and CVD. The first process is one of heating at a temperature from 300 to 650° C. and irradiation of a laser beam. As an example of the gas including the semiconductor element, there is gas including silicon such as silane, di-silane, or tri-silane. It is the second process to heat at a temperature from 400 to 650° C. The semiconductor film is doped with an impurity that imparts n-type. The metal element is one of Au, Al, Li, Mg, Ni, Co, Pt, and Fe.

The semiconductor film used for the electron emission portion according to the present invention includes silicon, and silicon-germanium ($Si_{1-x}Ge_x$:0<x<1, typically, x=0.001 to 0.05) may be used.

The first substrate used in the present invention, that is, the substrate with the cathode electrode, has at least the surface formed of an insulating material. Typically, a glass substrate of a commercial no-alkali glass such as barium borosilicate glass or aluminum borosilicate glass, a quartz substrate, a sapphire substrate, a semiconductor substrate that has an insulating film formed on the surface thereof, and a metal substrate that has an insulating film formed on the surface thereof can be given. Besides, the second substrate, that is, the substrate with an anode electrode to which a phosphor layer is put, formed of a translucent material. Typically, a glass substrate of a commercial no-alkali glass such as barium borosilicate glass or aluminum borosilicate glass, a quartz substrate, a sapphire substrate, and an organic resin substrate can be given.

BREIF DESCRIPTION OF THE DRAWINGS

DESCRIPTION OF THE PREFERRED EMBODIMENTS

Embodiment Modes

Hereinafter, embodiments of the present invention will be described with referent to the drawings.

Embodiment Mode 1

In the present embodiment mode, a field emission device that has a structure in which an electron emission portion as an electron source is simply provided on a cathode electrode without providing a gate electrode, that is, a field emission device of a diode-type FED and a display device that has the field emission device will be shown. Concretely, an explanation will be given on a field emission device in which a planar cathode electrode is formed on a whole first substrate, a planar anode electrode to which a phosphor layer is put is formed on a whole second substrate, and an electron emission portion is provided at a surface of the cathode electrode, and a manufacturing process of a display device that has the field emission device. It is noted that the electron emission portion has a conical shape.

Figure 1A:
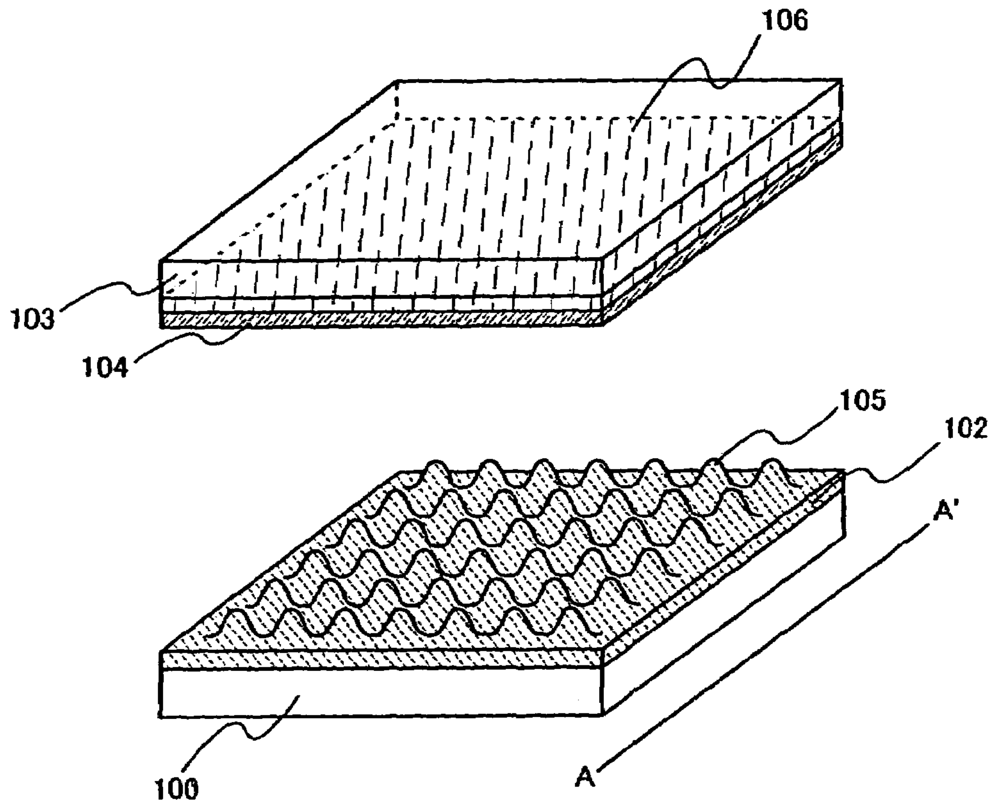
FIG. 1A is a perspective view showing a display panel of a field emission display device according to Embodiment Mode 1 of the present invention.

FIG. 1A shows a perspective view of a display panel in the present embodiment mode. A planar cathode electrode 102 of a semiconductor film is formed over a first substrate 100 and a planar anode electrode 104 is formed over a second substrate 103. At a surface of the cathode electrode, an electron emission portion 105 is formed.

Figure 1B:
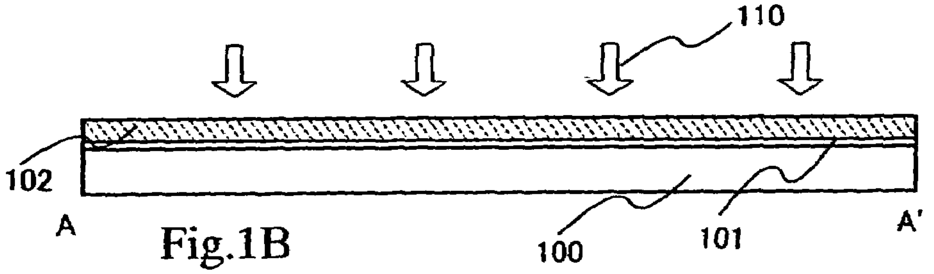
FIGS. 1B and 1C are sectional views showing a manufacturing process of the field emission device according to Embodiment Mode 1 of the present invention.
Figure 1C:
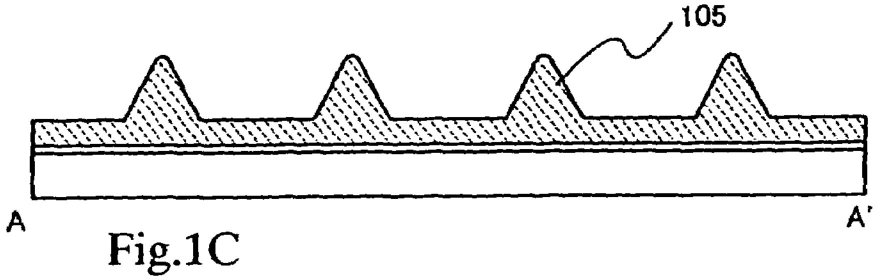

FIG. 1B shows a sectional view along A-A' of FIG. 1A. With reference to FIG. 1B, a manufacturing method of the field emission device according to the present embodiment mode will be shown.

As shown in FIG. 1B, an insulating film 101 is formed on the first substrate 100. With the insulating film 101, a slight amount of alkali metal such as sodium (Na), which is included in a glass substrate, can be prevented from diffusing. On the insulating film 101, a semiconductor film 102 is formed with a known method such as CVD or PVD.

As the first substrate, it is possible to use a glass substrate, a quartz substrate, a sapphire substrate, a semiconductor substrate that has an insulating film formed on the surface thereof, and a metal substrate that has an insulating film formed on the surface thereof. Although the substrate has any size, it is possible to use a large-sized substrate such as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm. Besides, the semiconductor film 102 may be an amorphous semiconductor film or a crystalline semiconductor film. When an amorphous semiconductor film is crystallized with a known crystallization method such as laser crystallization, rapid thermal annealing (RTA), thermal crystallization with furnace annealing, or thermal crystallization that uses a metal element for promoting crystallization, a crystalline semiconductor film can be formed. Although it is preferable that the semiconductor film 102 has a film thickness from 0.03 to 0.3 μm, the film thickness is not limited thereto. It is also preferable that the semiconductor film 102 is doped with an impurity element that imparts n-type in order to enhance conductivity. As the impurity element that imparts n-type, it is possible to use an element belonging to Group 15 of the periodic table, typically, phosphorous (P) or arsenic (As).

Next, a laser beam 110 is irradiated to the semiconductor film 102 to form a convex portion of the semiconductor film to form the electron emission portion 105. As the laser beam 110, a pulse oscillation laser beam in a wavelength region absorbed into the semiconductor film, that is, with a wavelength from 100 to 600 nm is applied. The convex portion has a conical shape.

As the laser oscillator for the laser beam 110, a gas laser oscillator, a solid laser oscillator, or a metal laser oscillator is applied. As the gas laser oscillator, a laser oscillator that uses gas such as CO, $CO_2$, or $N_2$, or an excimer laser oscillator that uses gas such as KrF, XeCl, or Xe is applied. As the solid laser oscillator, a laser oscillator that uses a crystal, such as YAG, $YVO_4$, YLF, or $YalO_3$, doped with Cr, Nd, Er, Ho, Ce, Co, Ti, or Tm, is applied. As the metal laser oscillator, a copper vapor laser oscillator or a helium-cadmium laser oscillator can be applied. In the case of using a laser beam emitted from the solid laser oscillator, it is preferable to use one of second to fourth harmonics of a fundamental wave. When the laser beam is irradiated under conditions of a repeated pulse frequency from 5 to 300 Hz, an irradiated pulse energy density from 100 to 900 mJ/cm$^2$, preferably, 300 to 700 mJ/cm$^2$, and an irradiated pulse frequency from 30 to 400 times, it is possible to form a convex portion at 5 to 30/μm$^2$, which has a basal plane with a diameter of 300 nm or less, preferably from 50 to 300 nm, more preferably from 60 to 200 nm, and height (difference between the basal plane and an apex) from 150 to 400 nm. It is preferable that an atmosphere in irradiating the laser beam includes 1% or more oxygen.

Figure 13:
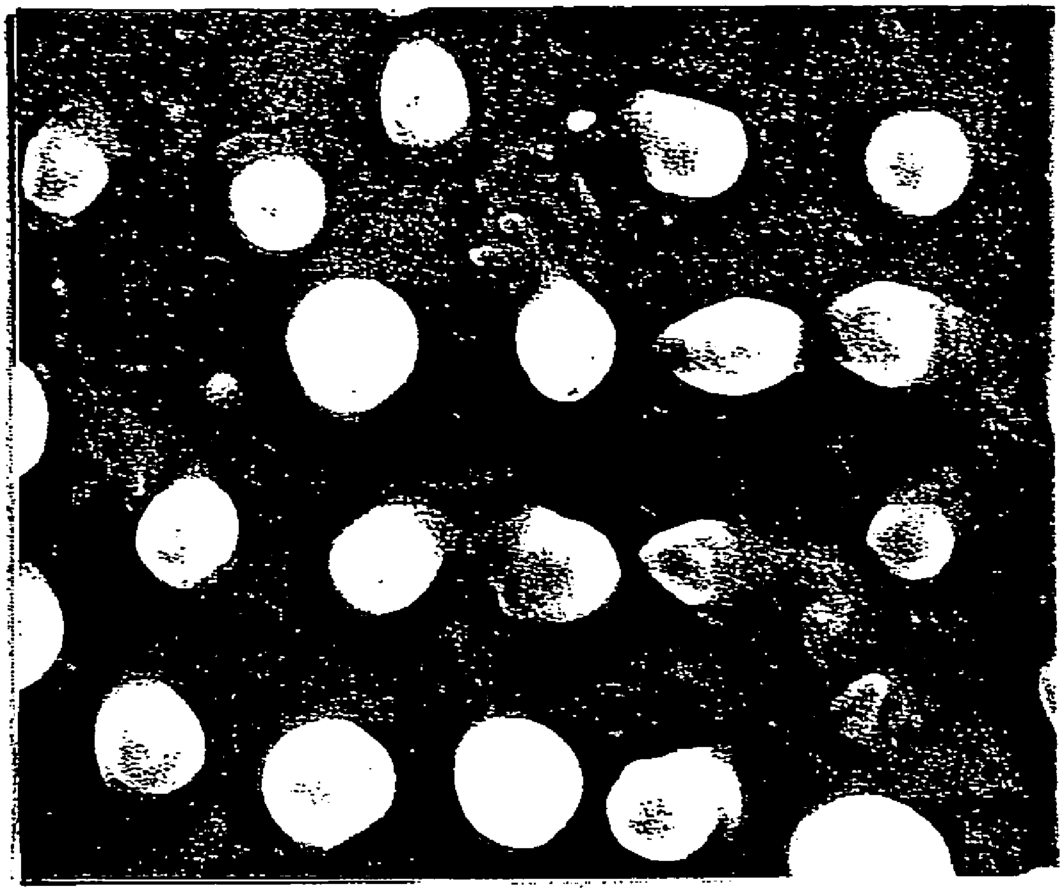
FIG. 13 is a diagram showing a surface of a cathode electrode manufactured according to Embodiment Mode 1 of the present invention.
Figure 14A:
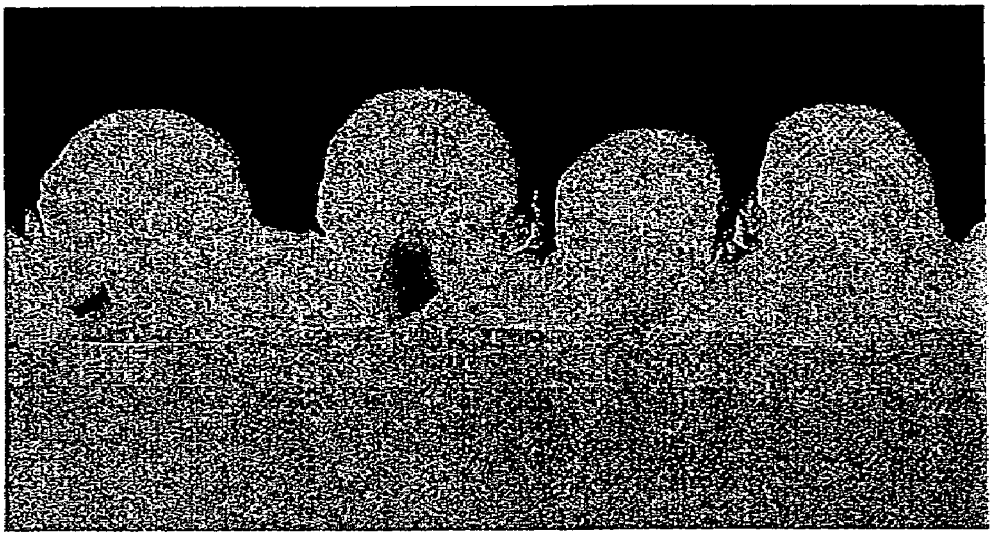
FIGS. 14A and 14B are diagrams showing a section of the cathode electrode manufactured according to Embodiment Mode 1 of the present invention.
Figure 14B:
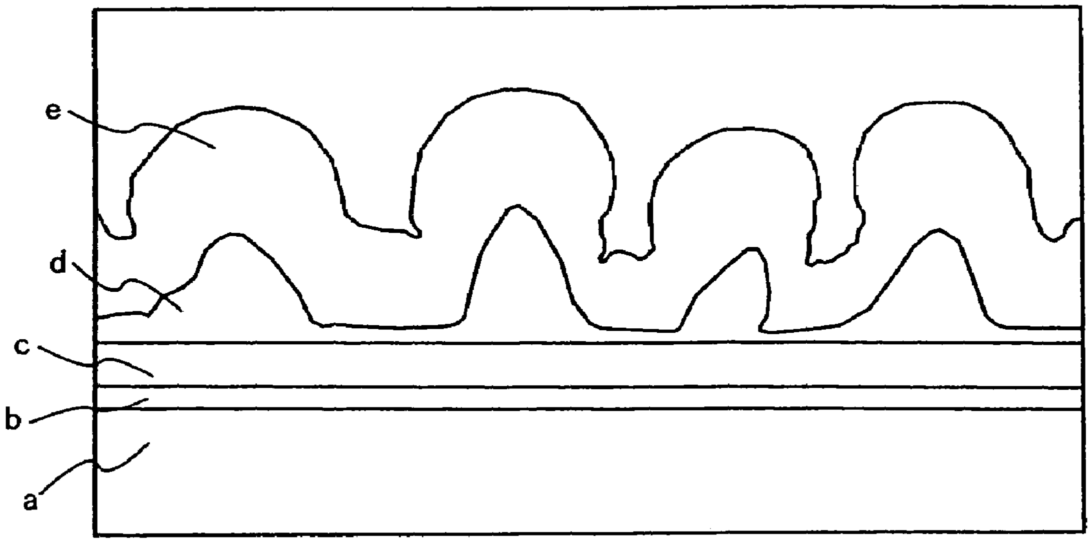

FIG. 13 shows a top view of electron emission portions of a field emission display device manufactured according to the present embodiment mode, which is observed with SEM. FIG. 14A shows a section of the same sample, which is observed with Scanning Electron Microscopy (SEM), and FIG. 14B shows FIG. 14A as a sort of pattern diagram. In FIG. 14B, a region a indicates a glass substrate as a substrate, regions b and c indicate silicon oxynitride films as an insulating film, a region d indicates a semiconductor film, a region e indicates a carbon film. A basal plane of the region d (nearly flat region viewed from the top) is included in a cathode electrode, and a convex portion on the cathode electrode is an electron emission portion. Thus, the regions a to d form a field emission device. It is noted that the sample has the insulating film with a laminated structure in which the region b is a first silicon oxynitride film containing nitrogen more than or nearly equal to oxygen and the region c is a second silicon oxynitride film containing oxygen more than nitrogen. Besides, the carbon film indicated as the region C is deposited in order to make it easy to observe the sample with SEM.

In order to manufacture the sample, a XeCl laser beam is used under conditions of an energy density of 485 mJ/cm$^2$, a frequency of 30 Hz, and an irradiated pulse frequency of 60 times. In the region d, a cone that has a basal plane with a diameter from 80 to 200 μm and a height (a vertical interval between the basal plane and an apex of the cone) from 250 to 350 nm is formed. The density of the cone is 10/μm$^2$. From FIGS. 14A and 14B, it is understood that the semiconductor film (region d) has the convex portion formed.

According to the processes mentioned above, it is possible to form a field emission device including a cathode electrode and a conical electron emission portion formed at a surface of the cathode electrode.

It is noted that a thin film of a metal element may be deposited on a surface of the electron emission portion manufactured according to the present embodiment mode, which is formed at the surface of the cathode electrode. In this case, it is possible, as the thin film, to use a thin film including a metal element such as tungsten, niobium, tantalum, molybdenum, chromium, aluminum, copper, gold, silver, titanium, or nickel.

Besides, a cathode electrode of a film including a metal element may be formed between the semiconductor film 102 and the insulating film 101. As a material of the cathode electrode, it is possible to use a metal element such as tungsten, niobium, tantalum, molybdenum, chromium, aluminum, copper, gold, silver, titanium, or nickel, or an alloy or a compound including the metal element (typically, nitride such as tantalum nitride or titanium nitride, silicide such as tungsten silicide, nickel silicide, molybdenum silicide).

Next, as shown in FIG. 1A, a phosphor layer 106 is formed on the second substrate 103 with a known method, and a conductive film with a film thickness form 0.05 to 0.1 μm is formed thereon to form the anode electrode 104. As the conductive film, a thin film including a metal element such as aluminum, nickel, or silver, or a transparent conductive film such as ITO (alloy of indium oxide-tin oxide), alloy of indium oxide-zinc oxide ($In_2O_3$—ZnO), or zinc oxide (ZnO) can be deposited with a known method, and a known patterning technique can be used.

As the phosphor layer, there are a red phosphor layer, a blue phosphor layer, and a green phosphor layer. The anode electrode may be formed on each phosphor layer. In the case of using a thin film including a metal element such as aluminum, nickel, or silver, or an alloy thin film including the metal element as a conductive film to become the anode electrode, light emitted from the phosphor is reflected to the side of the second substrate to enable improving luminance of a display screen.

The first and second substrates formed according to the present embodiment mode are bonded with a sealing member, and the pressure in a portion surrounded by the first and second substrate and the sealing member is reduced to form the display panel of a field emission display device.

The cathode electrode 102 formed over the first substrate 100 is connected to a cathode electrode driving circuit and the anode electrode 104 formed over the second substrate 103 is connected to an anode electrode driving circuit. It is possible to form the cathode electrode driving circuit and the anode electrode driving circuit on an extensional portion of the substrate. Alternatively, an external circuit such as an IC chip can be used. From the cathode electrode driving circuit, a relatively negative voltage is applied through the cathode electrode, and a relatively positive voltage is applied to the anode electrode from the anode electrode driving circuit. In response to the electric field generated due to the application of the voltages, an electron is emitted form the tip of the electron emission portion in accordance with quantum tunneling effect, and leaded to the side of the anode electrode. When the electron is made to collide with the phosphor layer put to the anode electrode, the phosphor layer is exited to emit light, and then a display can be obtained.

According to the processes mentioned above, the field emission display device is formed.

According to the processes mentioned above, it is possible to form a field emission device including a cathode electrode and a conical electron emission portion formed on at a surface of the cathode electrode, and a field emission display device including the field emission device.

According to the present embodiment mode, it is possible to form a field emission device without complicated processes. In addition, it is also possible to form a field emission device with the use of an inexpensive large-sized substrate. With the use of the filed emission device, it is possible to manufacture a surface light source of a liquid crystal display device or to an area-colored display device to become a device for electric spectaculars without complicated processes.

Embodiment Mode 2

In the present embodiment mode, a field emission device of a diode-type FED and a display device that has the field emission device will be shown similarly to Embodiment Mode 1. Specifically, an explanation will be given with reference to FIG. 2 and FIGS. 3A to 3C on a field emission device in which an electron emission portion is formed at an intersection of a stripe-shaped cathode electrode formed over a first substrate and a stripe-shaped anode electrode over a second substrate, and a field emission display device including the field emission device. It is noted that the manufacturing process of the electron emission portion, which is mentioned in Embodiment Mode 1, is applied to a manufacturing process of the electron emission portion in the present embodiment mode, and the electron emission portion has a conical shape.

Figure 2:
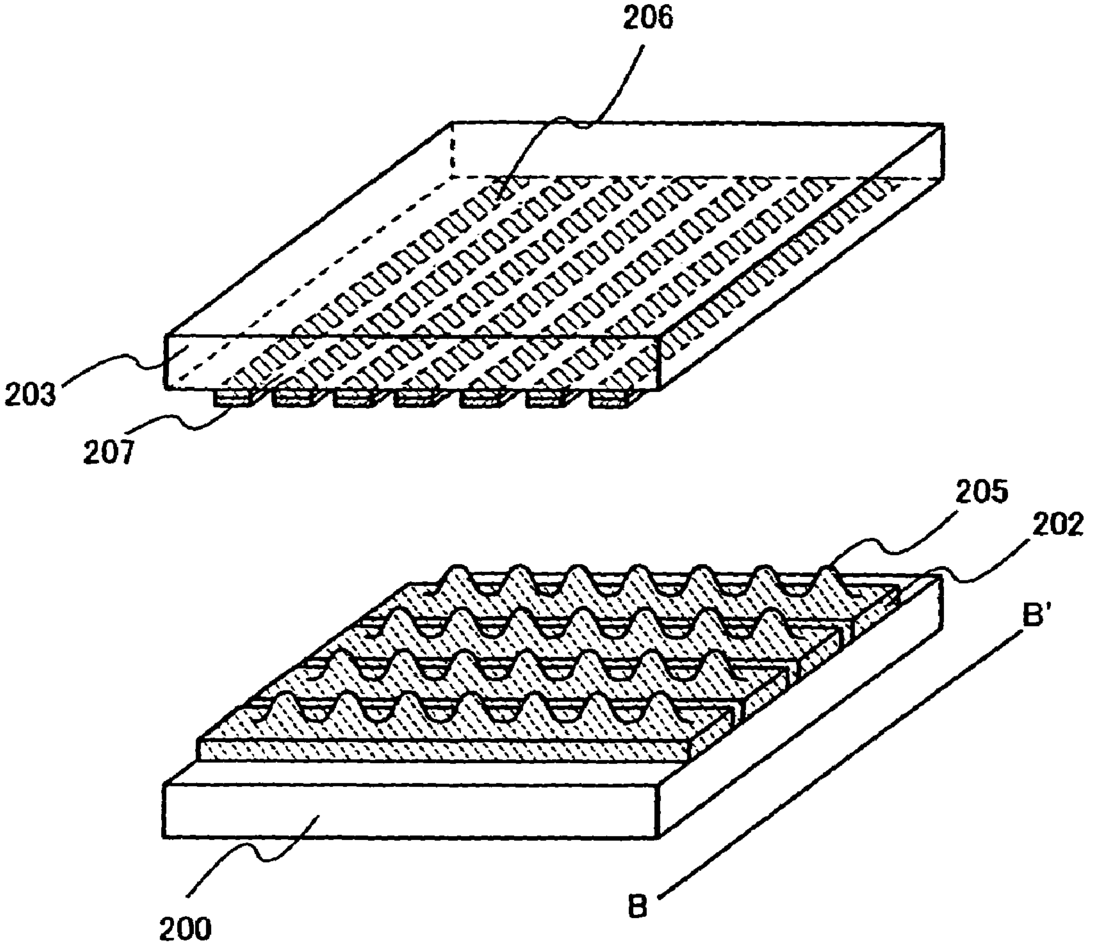
FIG. 2 is a perspective view showing a display panel of a field emission display device according to Embodiment Mode 2 of the present invention.

FIG. 2 shows a perspective view of a display panel in the present embodiment mode. An electron emission portion 205 is formed at an intersection, through a distance, of a stripe-shaped cathode electrode 202 of a semiconductor film formed over a first substrate 200 and a stripe-shaped anode electrode 207 formed over a second substrate. Although one conical electron emission portion is formed at an intersection of the cathode electrode and the anode electrode in FIG. 2 as a sort of pattern diagram, plural electron emission portions may be formed.

Figure 3A:
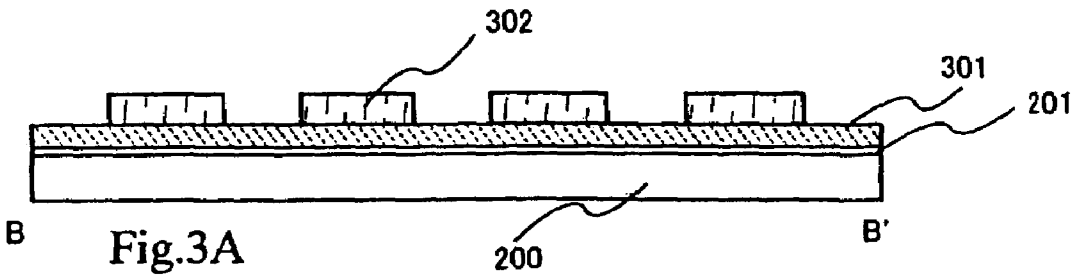
FIGS. 3A to 3C are sectional views showing a manufacturing process of the field emission device according to Embodiment Mode 2 of the present invention.
Figure 3B:
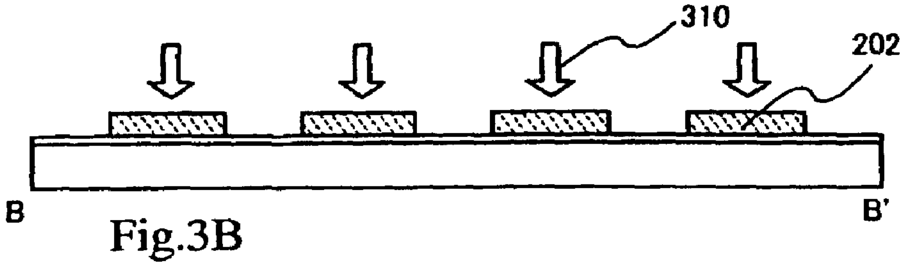
Figure 3C:
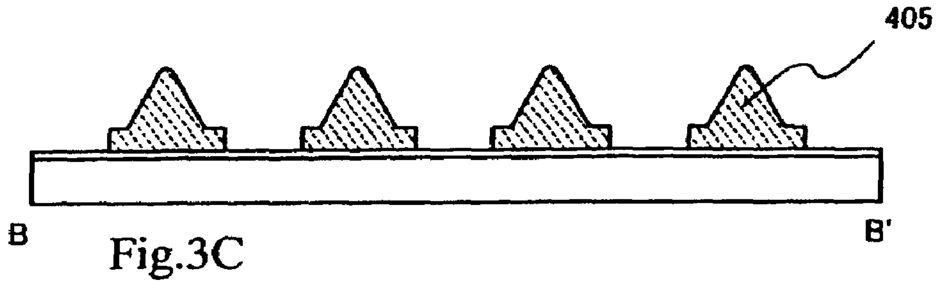

FIGS. 3A to 3C are sectional views along B-B' of FIG. 2. With reference to FIGS. 3A to 3C, a manufacturing method of the cathode electrode and the electron emission portion of the present embodiment mode will be shown. It is noted that the same numerals are used to show the same portions as those in FIG. 2.

Similarly to Embodiment Mode 1, a semiconductor film 301 is formed with a known method such as CVD or PVD after forming an insulating film 201 on the first substrate 200. At this point, it is preferable that the semiconductor film is doped with an impurity element that imparts n-type in order to enhance conductivity. As the impurity element that imparts n-type, it is possible to use an element belonging to Group 15 of the periodic table, typically, phosphorous (P) or arsenic (As).

Next, after a resist mask 302 is formed on a portion to form a cathode electrode, the semiconductor film 301 is etched into a stripe-shaped semiconductor film 202 (FIG. 3B).

Then, a laser beam 310 is irradiated to the stripe-shaped semiconductor film 202 to form a convex portion at a surface of the semiconductor film to form the conical electron emission portion 205. As the laser beam 310, a pulse oscillation laser beam in a wavelength region absorbed into the semiconductor film, that is, with a wavelength from 100 to 600 nm is applied.

As the laser oscillator for the laser beam 110, a gas laser oscillator, a solid laser oscillator, or a metal laser oscillator is applied. As the gas laser oscillator, a laser oscillator that uses gas such as CO, $CO_2$, or $N_2$, or an excimer laser oscillator that uses gas such as KrF, XeCl, or Xe is applied. As the solid laser oscillator, a laser oscillator that uses a crystal, such as YAG, $YVO_4$, YLF, or $YAlO_3$, doped with Cr, Nd, Er, Ho, Ce, Co, Ti, or Tm, is applied. As the metal laser oscillator, a copper vapor laser oscillator or a helium-cadmium laser oscillator can be applied. In the case of using a laser beam emitted from the solid laser oscillator, it is preferable to use one of second to fourth harmonics of a fundamental wave. The laser beam is irradiated under conditions of a repeated pulse frequency from 5 to 300 Hz, an irradiated pulse energy density from 100 to 900 mJ/$cm^2$, preferably 300 to 700 mJ/$cm^2$, and an irradiated pulse frequency from 30 to 400 times. It is preferable that an atmosphere in irradiating the laser beam includes 1% or more oxygen. According to the laser irradiation; it is possible to form a convex portion at 5 to 30 $\mu m^2$, which has a basal plane with a diameter from 50 to 300 nm, preferably from 80 to 200 nm, and height (difference between the basal plane and an apex) from 150 to 400 nm. According to the processes above, a field emission device of a field emission display device can be formed.

It is noted that a thin film of a metal element may be deposited on a surface of the electron emission portion manufactured according to the present embodiment mode, which is formed at the surface of the cathode electrode. In this case, it is possible, as the thin film, to use a thin film including a metal element such as tungsten, niobium, tantalum, molybdenum, chromium, aluminum, copper, gold, silver, titanium, or nickel.

Besides, a cathode electrode of a stripe-shaped film including a metal element may be formed between the semiconductor film 202 and the insulating film 201. In this case, the cathode electrode of the stripe-shaped film including the metal element is formed parallel to the semiconductor film. As a material of the cathode electrode, it is possible to use a metal element such as tungsten, niobium, tantalum, molybdenum, chromium, aluminum, copper, gold, silver, titanium, or nickel, or an alloy or a compound including the metal element (typically, nitride such as tantalum nitride or titanium nitride, silicide such as tungsten silicide, nickel silicide, molybdenum silicide).

Next, as shown in FIG. 2, a phosphor layer 206 is formed on the second substrate 203 with a known method, and a conductive film with a film thickness form 0.05 to 0.1 μm is formed thereon to form the striped-shaped anode electrode 207. As the conductive film, the conductive film in Embodiment Mode 1 can be applied.

As the phosphor layer, there are a red phosphor layer, a blue phosphor layer, and a green phosphor layer, and one pixel includes a set of red, blue, green phosphor layers. In order to enhance contrast, a black matrix (BM) may be formed between phosphor layers. The anode electrode may be formed on each phosphor layer, or over a pixel including red, blue, green phosphor layers.

The first and second substrates formed according to the present embodiment mode are bonded with a sealing member, and the pressure in a portion surrounded by the first and second substrate and the sealing member is reduced to form the display panel of the field emission display device.

In the present embodiment mode, a passive driving method is applied. The cathode electrode 202 formed over the first substrate 200 is connected to a cathode electrode driving circuit and the anode electrode 207 formed over the second substrate 203 is connected to an anode electrode driving circuit. It is possible to form the cathode electrode driving circuit and the anode electrode driving circuit on an extensional portion of the first substrate. Alternatively, an external circuit such as an IC chip can be used. From the cathode electrode driving circuit, a relatively negative voltage is applied through the cathode electrode, and a relatively positive voltage is applied to the anode electrode from the anode electrode driving circuit. In response to the electric field generated due to the application of the voltages, an electron is emitted form the tip of the electron emission portion in accordance with quantum tunneling effect, and leaded to the side of the anode electrode. When the electron is made to collide with the phosphor layer put to the anode electrode, the phosphor layer is exited to emit light, and then a display can be obtained.

According to the processes mentioned above, the field emission display device is formed.

According to the processes mentioned above, it is possible to form a field emission device including a cathode electrode and a conical electron emission portion formed on at a surface of the cathode electrode, and a display device including the field emission device.

According to the present embodiment mode, it is possible to form a field emission device and a display device including the field emission device on a large-sized substrate without complicated processes.

Embodiment Mode 3

Figure 4A:
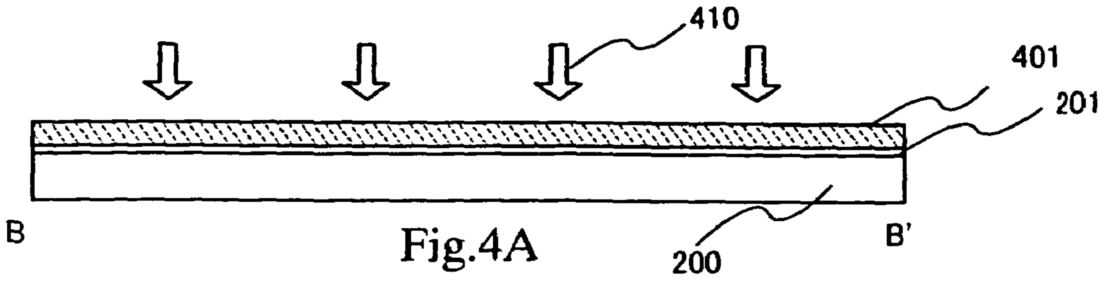
FIGS. 4A to 4D are sectional views showing a manufacturing process of a field emission device according to Embodiment Mode 3 of the present invention.
Figure 4B:
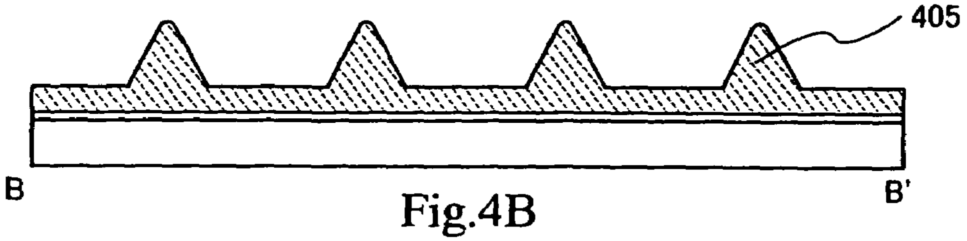
Figure 4C:
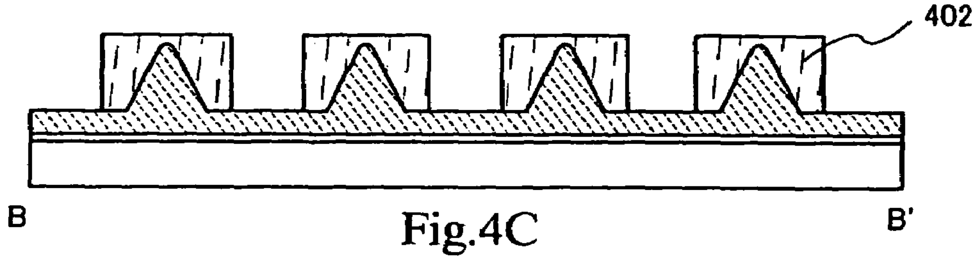
Figure 4D:
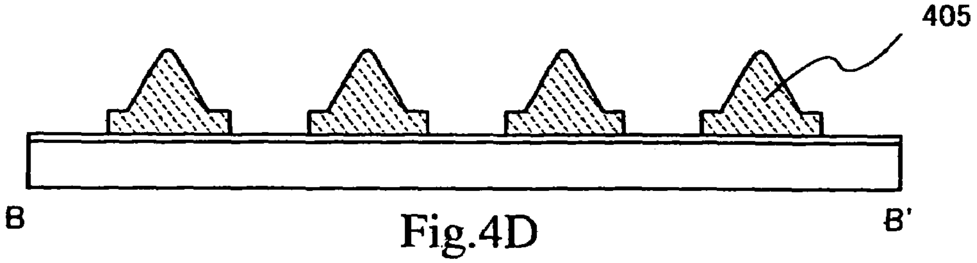

In the present embodiment mode, an explanation will be given with reference to FIGS. 4A to 4C on a method for manufacturing the field emission device as shown in Embodiment Mode 2 according to a different process from Embodiment Mode 2. FIGS. 4A to 4C are sectional views along B-B' of FIG. 2. The same numerals are used to show the same portions as those in FIG. 2.

Similarly to Embodiment Mode 1, a semiconductor film 401 is formed with a known method such as CVD or PVD after forming an insulating film 201 on the first substrate 200. At this point, it is preferable that the semiconductor film is doped with an impurity element that imparts n-type in order to enhance conductivity. As the impurity element that imparts n-type, it is possible to use an element belonging to Group 15 of the periodic table, typically, phosphorous (P) or arsenic (As).

Next, a laser beam 410 is irradiated to the semiconductor film 401 to form a convex portion at a surface of the semiconductor film to form a conical electron emission portion 405. Concerning the laser beam 410 and conditions in irradiating the laser beam, it is possible to refer to Embodiment Mode 2.

Next, after a resist mask 402 is formed on a portion to form a cathode electrode according to a known photolithography process (FIG. 4C), the semiconductor film is etched into a stripe-shaped cathode electrode that has a surface with the electron emission portion 405.

According to the processes mentioned above, it is possible to form a field emission device including a cathode electrode and a conical electron emission portion formed on at a surface of the cathode electrode.

According to the present embodiment mode, it is possible to form a field emission device on a large-sized substrate without complicated processes.

Embodiment Mode 4

In the present embodiment mode, an explanation will be given with reference to FIG. 5 and FIGS. 6A to 6D on a field emission device of a triode-type FED and a field emission display device including the field emission device. The field emission device to be mentioned in the present embodiment mode includes 1) an etched cathode electrode into the shape of a stripe and formed of a semiconductor film with n-type conductivity, 2) a gate electrode intersecting with the cathode electrode through an insulating film, and 3) a convex electron emission portion formed on a surface of the cathode electrode in an opening portion of the gate electrode and the insulating film.

Figure 5:
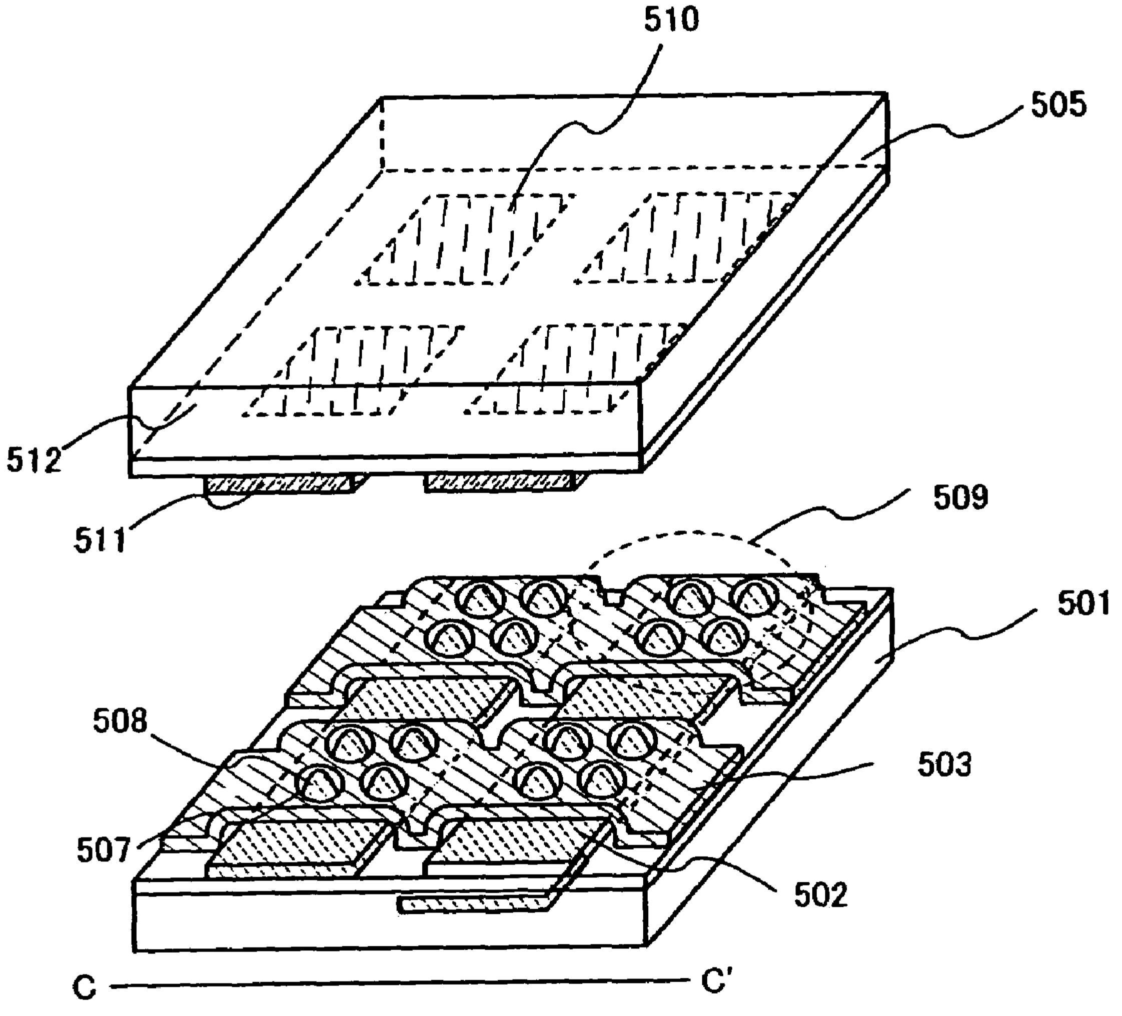
FIG. 5 is a perspective view showing a display panel of a field emission display device according to Embodiment Mode 4 of the present invention.

FIG. 5 shows a perspective view of a display panel in the present embodiment mode. Over a first substrate 501, a stripe-shaped cathode electrode 502 of a semiconductor film and a stripe-shaped gate electrode 503 that is orthogonal to the cathode electrode are formed. The gate electrode is formed over the cathode electrode with an insulating film (not shown in the figure) therebetween to insulate the gate electrode from the cathode electrode. At an intersection of the cathode electrode and the gate electrode, an opening portion 507 is formed, and a conical electron emission portion 508 is formed at a surface of the cathode electrode in the opening portion 507. On a second substrate 505, a phosphor layer 510 and an anode electrode 511 are formed.

FIGS. 6A to 6D show sectional views along C-C' of FIG. 5. With reference to FIGS. 6A to 6D, a manufacturing method of the field emission device according to the present embodiment mode will be shown.

Figure 6A:
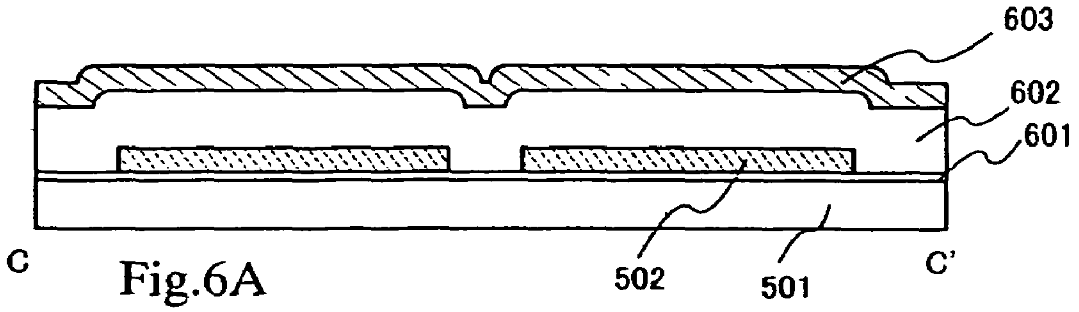
FIGS. 6A to 6D are sectional views showing a manufacturing process of the field emission device according to Embodiment Mode 4 of the present invention.

As shown in FIG. 6A, a first insulating film 601 is formed on the first substrate 501 similar to Embodiment Mode 1. With the first insulating film 601, a slight amount of alkali metal, which is included in a glass substrate, can be prevented from diffusing. On the first insulating film 601, a semiconductor film is formed with a known method such as CVD or PVD. Although it is preferable that the semiconductor film has a film thickness from 0.03 to 0.3 μm at this point, the film thickness is not limited thereto.

The semiconductor film 102 may be an amorphous semiconductor film or a crystalline semiconductor film. When an amorphous semiconductor film is crystallized with a known crystallization method such as laser crystallization RTA, thermal crystallization with furnace annealing, or thermal crystallization that uses a metal element for promoting crystallization, a crystalline semiconductor film can be formed.

Then, after a resist mask is formed on a portion to form a cathode electrode according to a known photolithography process, an exposed portion of the semiconductor film is etched with dry etching or wet etching to form a stripe-shaped semiconductor film 502, which functions as a cathode electrode later.

Next, a second insulating film 602 is formed on the semiconductor film that is the cathode electrode. As the second insulating film, it is possible to form a single layer or a lamination layer including at least one of silicon oxide, silicon nitride, silicon oxide including nitrogen, SOG (Spin on Glass, typically siloxane polymer), acrylic, polyimide, polyimideamide, and benzocyclobutene. The second insulating film has a film thickness from 0.5 to 2 μm, and is formed with a known method such as CVD, PVD, application, or screen printing.

Then, the semiconductor film 502 is doped with an impurity element that imparts n-type in order to enhance conductivity. As the impurity element that imparts n-type, it is possible to use an element belonging to Group 15 of the periodic table, typically, phosphorous (P) or arsenic (As). The process of doping with the n-type impurity may be conducted before forming the second insulating film 602.

Next, a conductive film 603 is formed. As the conductive film 603, a thin film including a metal element such as tungsten, niobium, tantalum, molybdenum, chromium, aluminum, copper, gold, silver, titanium, or nickel, or an alloy including the metal element is used. After known photolithography process is used to form a resist mask on the conductive film 603, etching is performed to remove an unnecessary portion of the conductive film 603, and then a stripe-shaped gate electrode is formed.

Figure 6B:
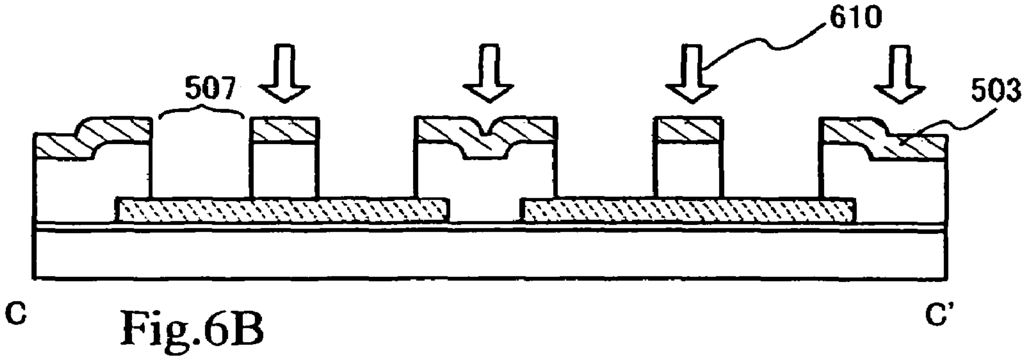

Then, as shown in FIG. 6B, the opening portion 507 is formed in a region where the cathode electrode is intersected with the gate electrode through the second insulating film 602. After forming a resist mask into a desired shape according to a known photolithography process, the gate electrode and the second insulating film are etched to expose the semiconductor film to form the opening portion 507.

Figure 6C:
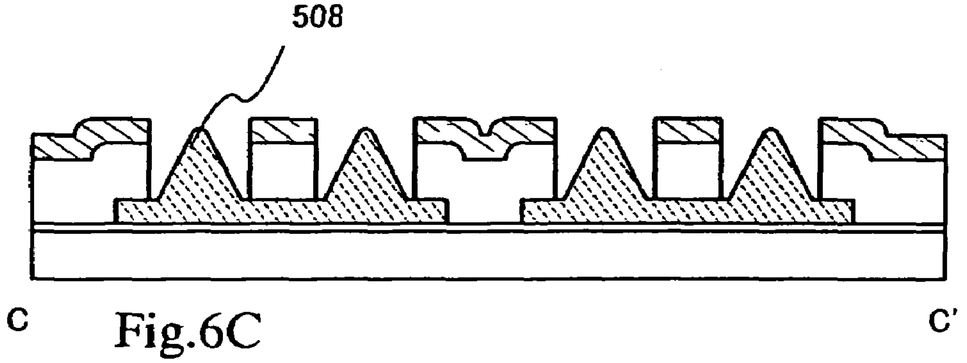

Next, a laser beam 610 is irradiated to form a convex portion of the semiconductor film to form the electron emission portion 508 (FIG. 6C). As the laser beam 610, a pulse oscillation laser beam in a wavelength region absorbed into the semiconductor film, that is, with a wavelength from 100 to 600 nm is applied. As the laser oscillator for the laser beam 110, a gas laser oscillator, a solid laser oscillator, or a metal laser oscillator is applied. As the gas laser oscillator, a laser oscillator that uses gas such as CO, $CO_2$, or $N_2$, or an excimer laser oscillator that uses gas such as KrF, XeCl, or Xe is applied. As the solid laser oscillator, a laser oscillator that uses a crystal, such as YAG, $YVO_4$, YLF, or $YalO_3$, doped with Cr, Nd, Er, Ho, Ce, Co, Ti, or Tm, is applied. As the metal laser oscillator, a copper vapor laser oscillator or a helium-cadmium laser oscillator can be applied. In the case of using a laser beam emitted from the solid laser oscillator, it is preferable to use one of second to fourth harmonics of a fundamental wave. In addition, it is preferable that an atmosphere in irradiating the laser beam includes 1% or more oxygen. When the laser beam is irradiated under conditions of a repeated pulse frequency from 5 to 300 Hz, an irradiated pulse energy density from 100 to 900 mJ/cm$^2$, preferably 300 to 700 mJ/cm$^2$, and an irradiated pulse frequency from 30 to 400 times, it is possible to form a convex portion from 5 to 30/μm$^2$, which has a basal plane with a diameter from 50 to 300 nm, preferably from 80 to 200 μm, and height (difference between the basal plane and an apex) from 150 to 400 nm.

Figure 6D:
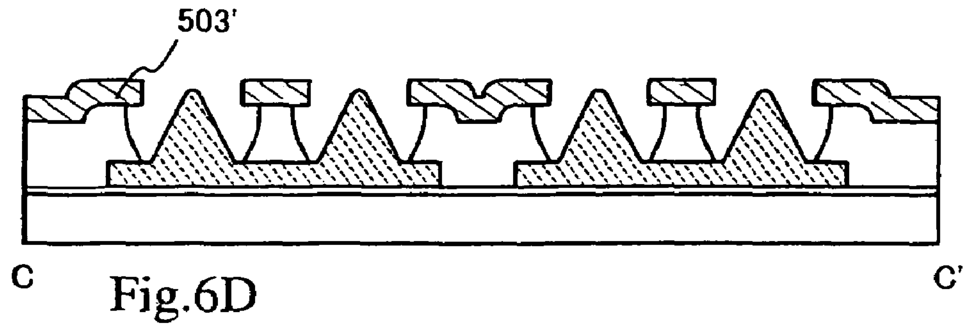

After that, as shown in FIG. 6D, it is preferable that isotropic etching such as wet etching is performed to remove a portion of the second insulating film below the gate electrode 503 to form a gate electrode 503' protruding from the second insulating film in the shape of an appentice.

It is noted that a thin film of a metal element may be deposited on a surface of the electron emission portion 508 manufactured according to the present embodiment mode. In this case, it is possible, as the thin film, to use a thin film including a metal element such as tungsten, niobium, tantalum, molybdenum, chromium, aluminum, copper, gold, silver, titanium, or nickel.

In FIG. 5, although four (2×2) electron emission portions are formed at an intersection 509 of the cathode electrode and the gate electrode, there is no limitation, and more electron emission portions may be formed. In one opening portion, plural electron emission portion may be formed.

As a cathode electrode, a stripe-shaped film including a metal element, which has contact with the semiconductor film, may be formed between the semiconductor film 502 and the first insulating film 601. As a material of the cathode electrode, it is possible to use the materials in Embodiment Mode 1.

According to the processes mentioned above, it is possible to form a field emission device including a conical electron emission portion formed over a first substrate.

As shown in FIG. 5, the phosphor layer 510 is formed on the second substrate 505 with a known method, and the anode electrode 511 with a film thickness form 0.05 to 0.1 μm is formed thereon. As the anode electrode 511, a thin film including a metal element such as aluminum, nickel, or silver, or a transparent conductive film such as ITO (alloy of indium oxide-tin oxide), alloy of indium oxide-zinc oxide ($In_2O_3$—ZnO), or zinc oxide (ZnO) can be deposited with a known method. In the present embodiment mode, the anode electrode may have a stripe shape, a rectangular matrix shape, or a sheet shape. As the phosphor layer, there are a red phosphor layer, a blue phosphor layer, and a green phosphor layer, and one pixel includes a set of red, blue, green phosphor layers. In order to enhance contrast, it is preferable to form a black matrix 512 between phosphor layers. In the case of using a thin film including a metal element such as aluminum, nickel, or silver, or an alloy thin film including the metal element as a conductive film to become the anode electrode, light emitted from the phosphor is reflected to the side of the second substrate to enable improving luminance of a display screen.

The first and second substrates formed according to the present embodiment mode are bonded with a sealing member, and the pressure in a portion surrounded by the first and second substrate and the sealing member is reduced to form the display panel of the field emission display device.

In the present embodiment mode, a passive driving method is applied. The cathode electrode 502 is connected to a cathode electrode driving circuit, the gate electrode 503 is connected to a gate electrode driving circuit, and the anode electrode 511 is connected to an anode electrode driving circuit. It is possible to form the cathode electrode driving circuit, the gate electrode driving circuit, and the anode electrode driving circuit on an extensional portion of the substrate. Alternatively, an external circuit such as an IC chip can be used. From the cathode electrode driving circuit, a relatively negative voltage (0 kV, for example) is applied through the cathode electrode, and a relatively positive voltage (50 V, for example) is applied to the gate electrode from the gate electrode driving circuit. In response to the electric field generated due to the application of the voltages, an electron is emitted from the tip of the convex portion in accordance with quantum tunneling effect. From the anode electrode driving circuit, a higher voltage (5 kV, for example) than the positive voltage applied to the gate electrode is applied to lead the electron emitted from the electron emission portion to the phosphor layer put to the anode electrode. When the electron is made to collide with the phosphor layer, the phosphor layer is exited to emit light, and then a display can be obtained. In the present embodiment mode, it is also possible to form the cathode electrode driving circuit and the gate electrode driving circuit together with the field emission device.

According to the processes mentioned above, the field emission display device is formed.

According to the present embodiment mode, it is possible to form a field emission device and a field emission display device including the field emission device on a large-sized substrate without complicated processes.

Embodiment Mode 5

In the present embodiment mode, an explanation will be given with reference to FIG. 7 and FIGS. 8A to 8D on a field emission device of a triode-type FED and a field emission display device including the field emission device. The field emission device to be mentioned in the present embodiment mode includes 1) an etched semiconductor film into a desired shape, which includes source and drain regions, 2) an etched source wiring in the shape of a stripe, which has contact with the source region of the semiconductor film, 3) a gate electrode intersecting with the source wiring through an insulating film, which controls the carrier concentration between the source and drain regions of the semiconductor film, and 4) a convex electron emission portion formed at a surface of the drain region of the semiconductor film in an opening portion of the gate electrode and the insulating film. In the present embodiment mode, the gate electrode has a comb shape. In addition, a cathode electrode of the field emission device includes at least the drain region in the present embodiment.

Figure 7:
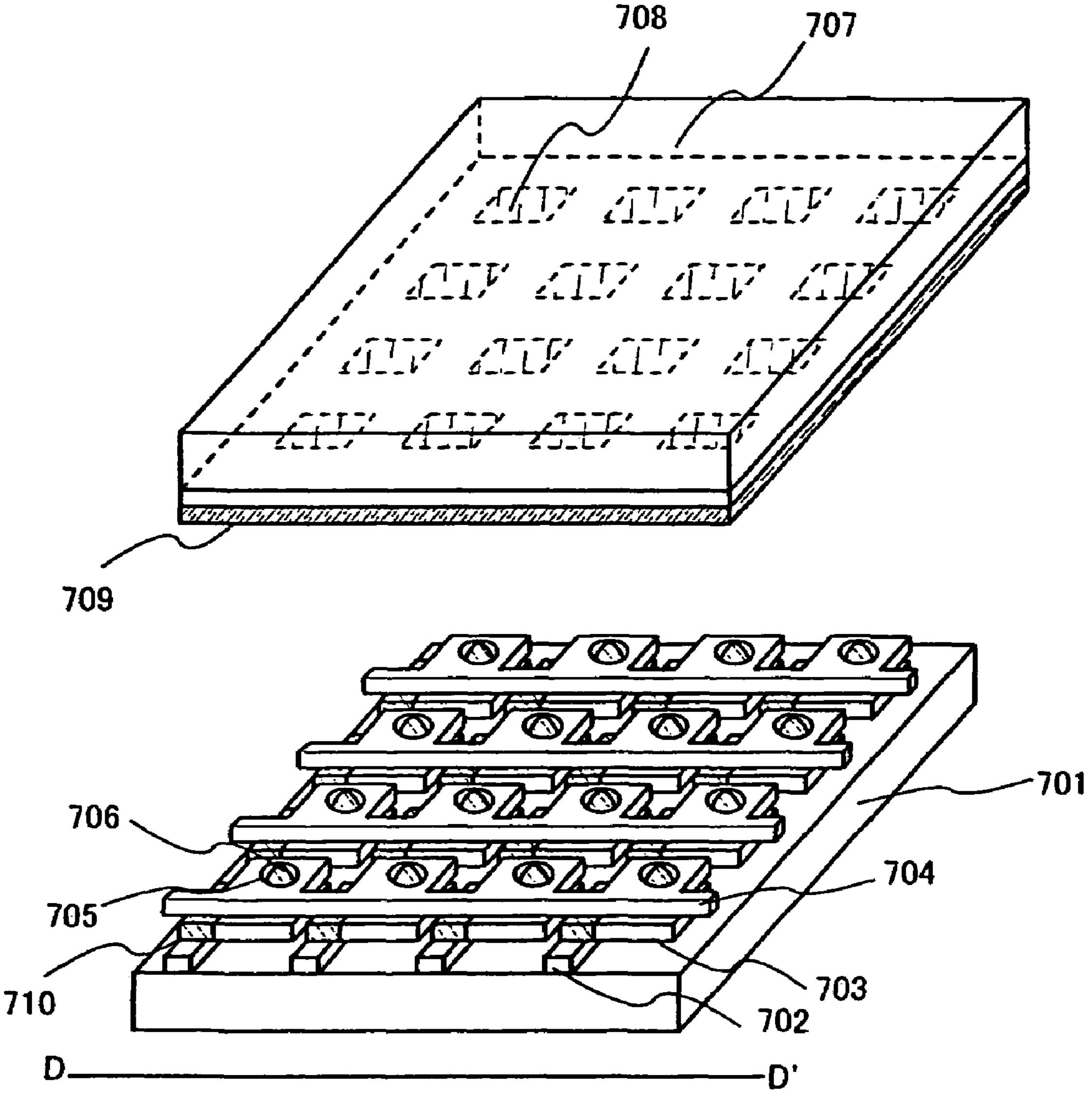
FIG. 7 is a perspective view showing a display panel of a field emission display device according to Embodiment Mode 5 of the present invention.

FIG. 7 shows a perspective view of a display panel in the present embodiment mode. Over a first substrate 701, a stripe-shaped source wiring 702, an etched semiconductor film 703 in a desired shape, which is formed to have contact with the source wiring, and a comb-shaped gate electrode 704 that is orthogonal to the source wiring through an insulating film (not shown in the figure) are formed. The gate electrode is formed over the semiconductor film. In the gate electrode and the insulating film, an opening portion 705 is formed to expose a region of the semiconductor film 703, which has no contact with the source wiring. In the opening portion 705, a conical electron emission portion 706 is formed at a surface of the drain region of the semiconductor film 703.

As shown in FIG. 7, a phosphor layer 708 and an anode electrode 709 are formed on a second substrate 707.

FIGS. 8A to 8D show sectional views along D-D' of FIG. 7. With reference to FIGS. 8A to 8D, a manufacturing method of the field emission device according to the present embodiment mode will be shown.

Figure 8A:
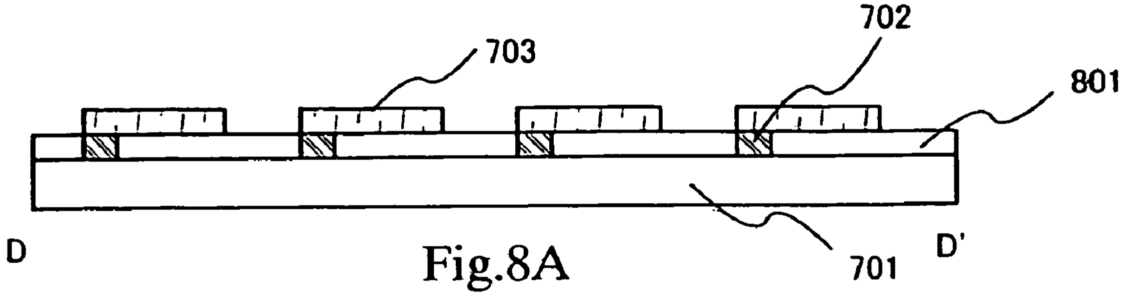
FIGS. 8A to 8D are sectional views showing a manufacturing process of the field emission device according to Embodiment Mode 5 of the present invention.

As shown in FIG. 8A, after forming a first conductive film on the first substrate 701, a resist mask is used to form the stripe-shaped source wiring 702. Then, after forming a first insulating film, polishing of the first insulating film is performed with a method such as CMP to expose the source wiring with planarization, and an insulating film 801 is formed between the source wirings. On the insulating film 801 and the source wiring 702, a semiconductor film is formed with a known method such as CVD or PVD. After that, the semiconductor film is etched to form a semiconductor film 703 in the desired shape. As the first substrate, it is possible to use a glass substrate, a quartz substrate, a sapphire substrate, a semiconductor substrate that has an insulating film formed on the surface thereof, and a metal substrate that has an insulating film formed on the surface thereof. Although the substrate has any size, it is possible to use a large-sized substrate such as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm. Before forming the source wiring on the first substrate, an insulating film may be formed for blocking a slight amount of alkali metal such as sodium (Na), which is included in a glass substrate.

Figure 8B:
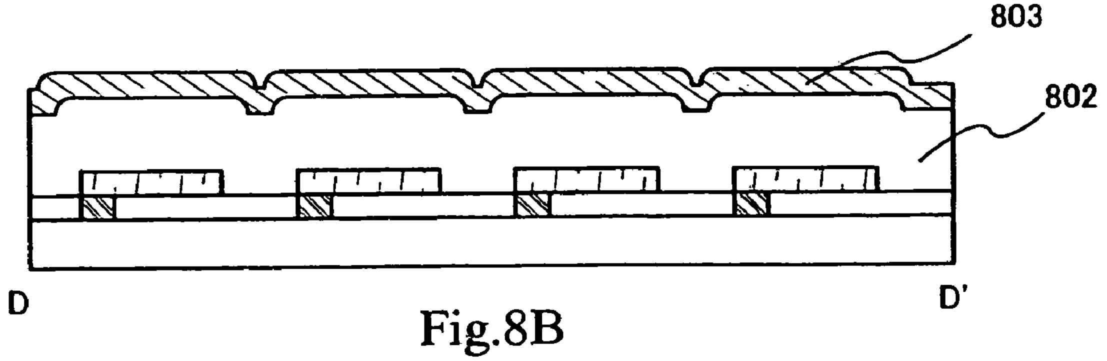

Next, as shown in FIG. 8B, a second insulating film 802 is formed on the semiconductor film 703 and the insulating film 801. As the second insulating film, it is possible to manufacture a single layer or a lamination layer including at least one of silicon oxide, silicon nitride, silicon oxide including nitrogen, SOG (Spin on Glass, typically siloxane polymer), acrylic, polyimide, polyimideamide, and benzocyclobutene. The second insulating film has a film thickness from 0.5 to 2 μm, and is formed with a known method such as CVD, PVD, application, or screen printing.

Next, a second conductive film 803 is formed. As the second conductive film, it is possible to use a thin film including the same metal element as the conductive film (the conductive film 603 in FIG. 6A) in Embodiment Mode 4, or a an alloy including the metal element. After forming a resist mask on the conductive film 803, patterning is conducted to remove an unnecessary portion of the conductive film 803 to form a comb-shaped gate electrode intersecting with the source wiring through the semiconductor film 703 and the second insulating film 802.

Figure 8C:
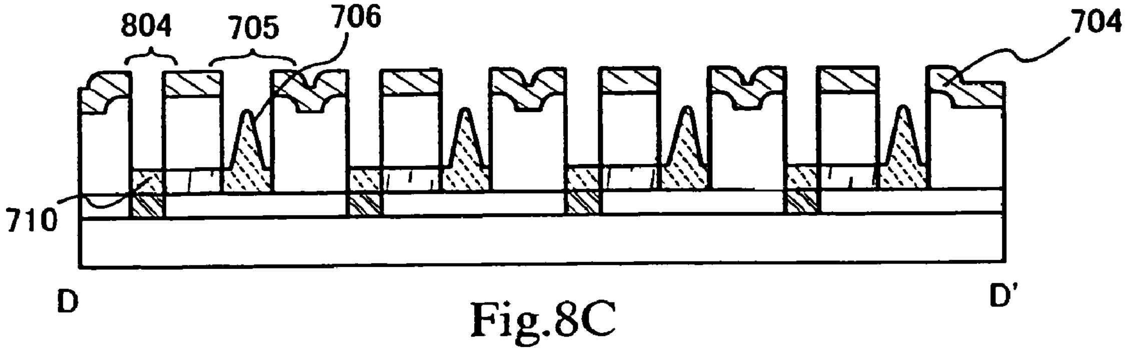

Next, as shown in FIG. 8C, regions to become the source and drain regions are formed. The gate electrode and the second insulating film have a portion over the source wiring and a portion on the semiconductor film for forming the electron emission portion (a region with a predetermined distance from a region that has contact with the source wiring) subjected to etching to expose the semiconductor film (the source region) 804 on the source wiring as well as to form the opening portion 705.

Next, a laser beam is irradiated to form a convex portion of the semiconductor film to form the electron emission portion 706. As the laser beam 610, a pulse oscillation laser beam in a wavelength region absorbed into the semiconductor film, that is, with a wavelength from 100 to 600 nm is applied. As the laser oscillator for the laser beam 110, a gas laser oscillator, a solid laser oscillator, or a metal laser oscillator is applied. As the gas laser oscillator, a laser oscillator that uses gas such as CO, $CO_2$, or $N_2$, or an excimer laser oscillator that uses gas such as KrF, XeCl, or Xe is applied. As the solid laser oscillator, a laser oscillator that uses a crystal, such as YAG, $YVO_4$, YLF, or $YalO_3$, doped with Cr, Nd, Er, Ho, Ce, Co, Ti, or Tm, is applied. As the metal laser oscillator, a copper vapor laser oscillator or a helium-cadmium laser oscillator can be applied. In the case of using a laser beam emitted from the solid laser oscillator, it is preferable to use one of second to fourth harmonics of a fundamental wave. In addition, it is preferable that an atmosphere in irradiating the laser beam includes 1% or more oxygen. When the laser beam is irradiated under conditions of a repeated pulse frequency from 5 to 300 Hz, an irradiated pulse energy density from 100 to 900 mJ/cm$^2$, preferably 300 to 700 mJ/cm$^2$, and an irradiated pulse frequency from 30 to 400 times, it is possible to form a convex portion from 5 to 30 μm$^2$, which has a basal plane with a diameter from 50 to 300 nm, preferably from 80 to 200 μm, and height (difference between the basal plane and an apex) from 150 to 400 nm.

Then, doping with an impurity element that imparts n-type is conducted to form the source region (710) and the drain region (706). As the impurity element that imparts n-type, it is possible to use an element belonging to Group 15 of the periodic table, typically, phosphorous (P) or arsenic (As).

Figure 8D:
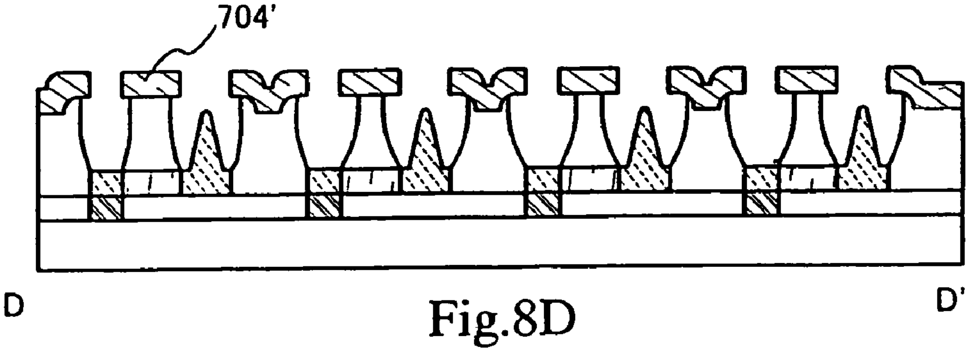

After that, as shown in FIG. 8D, it is preferable that isotropic etching such as wet etching is performed to remove a portion of the second insulating film below the gate electrode 704 to form a gate electrode 704' protruding from the second insulating film in the shape of an appentice.

It is noted that a thin film of a metal element may be deposited on a surface of the electron emission portion 706 manufactured according to the present embodiment mode. ID this case, it is possible, as the thin film, to use a thin film including a metal element such as tungsten, niobium, tantalum, molybdenum, chromium, aluminum, copper, gold, silver, titanium, or nickel.

Although one electron emission portions is shown in the opening portion 705 in FIG. 7 as a sort of pattern diagram, and more electron emission portions may be formed.

According to the processes mentioned above, the field emission device that including the semiconductor film that has the source and drain region, the source wiring that has contact with the source region of the semiconductor film, the gate electrode, and the conical electron emission portion formed at the surface of the drain region of the semiconductor film, is formed. In order to more precisely control switching of ON/OFF of the field emission device, a switching element such as a thin film transistor or a diode may additionally be provided in each field emission device.

The first substrate formed according to the present embodiment mode and the second substrate formed according to a similar process to Embodiment Mode 4 are bonded with a sealing member, and the pressure in a portion surrounded by the first and second substrate and the sealing member is reduced to form the display panel of the field emission display device.

The source wiring 702 is connected to a source wiring driving circuit, the gate electrode 704 is connected to a gate electrode driving circuit, and the anode electrode 709 is connected to an anode electrode driving circuit. It is possible to form the source wiring driving circuit, the gate electrode driving circuit, and the anode electrode driving circuit on an extensional portion of the first substrate. Alternatively, an external circuit such as an IC chip can be used. The source wiring has contact with the source region of the semiconductor film, and the drain region is one of the elements forming the field emission device. When a positive voltage is applied to the gate electrode from the gate electrode driving circuit, a carrier is generated in a channel-forming region between the source and drain regions, and an electron is emitted from the electron emission portion in the drain region. From the anode electrode driving circuit, a higher voltage than the positive voltage applied to the gate electrode is applied to lead the electron emitted from the electron emission portion to the phosphor layer put to the anode electrode. When the electron is made to collide with the phosphor layer, the phosphor layer is exited to emit light, and then a display can be obtained. In the present embodiment mode, it is also possible to form the source wiring driving circuit and the gate electrode driving circuit together with the field emission device.

According to the processes mentioned above, the field emission display device is formed.

According to the present embodiment mode, it is possible to form a field emission device and a field emission display device including the field emission device on a large-sized substrate without complicated processes. A field emission display device according to the present embodiment mode has an electron emission portion formed in a drain region of a switching element in each pixel. Accordingly, it is possible to form a display device with high resolution since electron emission can be controlled in each pixel.

Embodiment Mode 6

In the present embodiment mode, an explanation will be given with reference to FIG. 9 and FIGS. 10A to 10D on a field emission device of a triode-type FED according to a different manufacturing method from Embodiment Mode 5 and a field emission display device including the field emission device. The field emission device to be mentioned in the present embodiment mode includes 1) an etched semiconductor film into a desired shape, which includes source and drain regions, 2) an etched source wiring in the shape of a stripe, which has contact with the source region of the semiconductor film, 3) a gate electrode intersecting with the source wiring through an insulating film, which controls the carrier concentration between the source and drain regions, and 4) a convex electron emission portion formed at a surface of the drain region of the semiconductor film in an opening portion of the gate electrode and the insulating film. In the present embodiment mode, the gate electrode has a stripe shape. In addition, a cathode electrode of the field emission device includes at least the drain region in the present embodiment.

Figure 9:
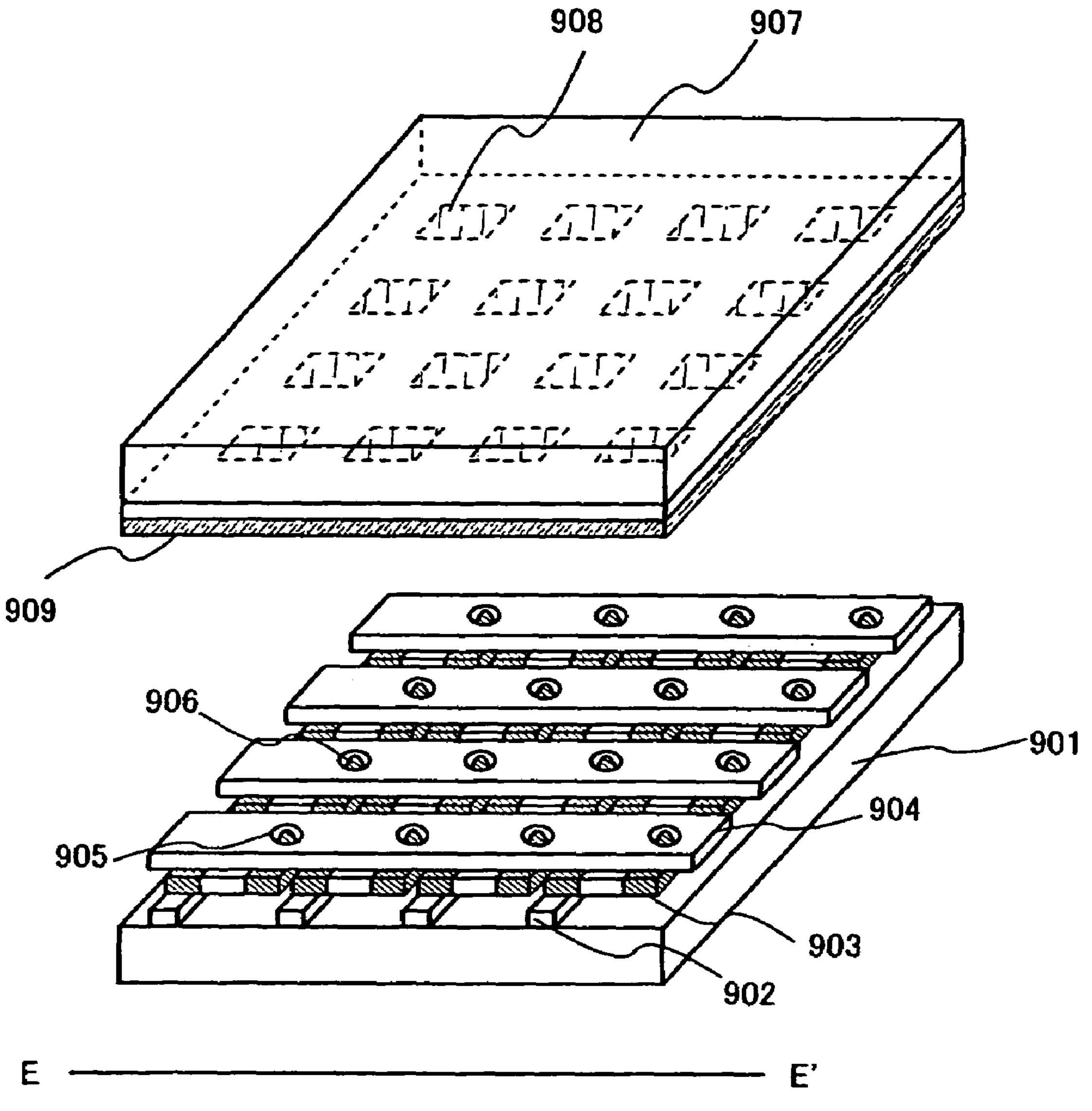
FIG. 9 is a perspective view showing a display panel of a field emission display device according to Embodiment Mode 6 of the present invention.

FIG. 9 shows a perspective view of a display panel in the present embodiment mode. Over a first substrate 901, a stripe-shaped source wiring 902, an etched semiconductor film 903 in a desired shape, which is formed to have contact with the source wiring, and a stripe-shaped gate electrode 904 formed in a direction orthogonal to the source wiring are formed. The gate electrode is formed over the semiconductor film with an insulating film (not shown in the figure) therebetween. In the gate electrode and the insulating film, an opening portion 905 is formed to expose a region of the semiconductor film 903, which has no contact with the source wiring. In the opening portion 905, a conical electron emission portion 906 is formed at a surface of the drain region of the semiconductor film 903. The gate electrode of the field emission device in the present embodiment mode, which is formed over the first substrate, has a different shape from that disclosed in Embodiment Mode 5.

As shown in FIG. 9, a phosphor layer 908 and an anode electrode 909 are formed on a second substrate 907.

FIGS. 10A to 10D show sectional views along E-E' of FIG. 9. With reference to FIGS. 10A to 10D, a manufacturing method of the field emission device according to the present embodiment mode will be shown.

Similarly to Embodiment Mode 5, the source wiring 902, a first insulating film 1001, and the semiconductor film 903 in the desired shape are formed on the first substrate 901. Before forming the source wiring on the first substrate, an insulating film may be formed for blocking a slight amount of alkali metal such as sodium (Na), which is included in a glass substrate.

Next, after forming a resist mask (not shown in the figure) on the semiconductor film 903, doping with an impurity element that imparts n-type is conducted to form the source region 1002 and the drain region 1003. As the impurity element that imparts n-type, it is possible to use an element belonging to Group 15 of the periodic table, typically, phosphorous (P) or arsenic (As).

Figure 10A:
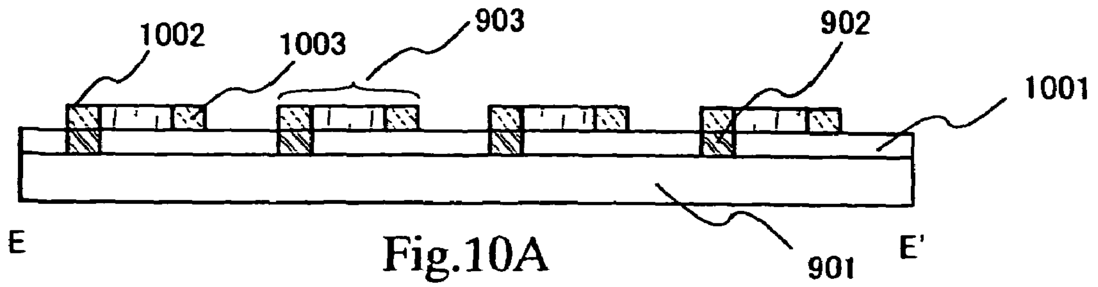
FIGS. 10A to 10D are sectional views showing a manufacturing process of the field emission device according to Embodiment Mode 6 of the present invention.
Figure 10B:
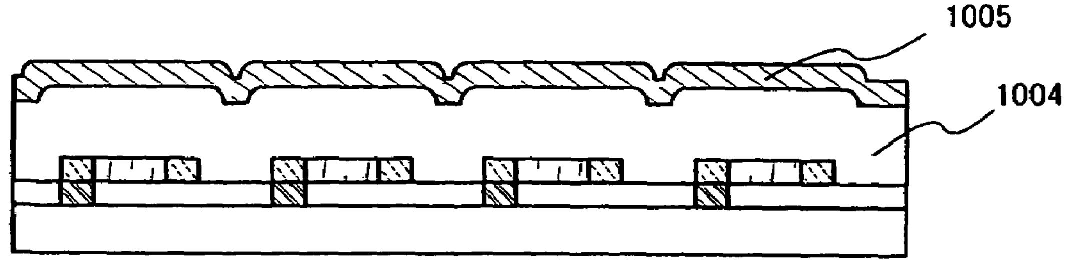

Next, as shown in FIG. 10B, a second insulating film 1004 and a conductive film 1005 are formed on the semiconductor film 903 and the first insulating film 1001 similarly to Embodiment Mode 5. As each of the second insulating film 1004 and the conductive film 1005, the materials in Embodiment Mode 4 or 5 can be appropriately applied.

Figure 10C:
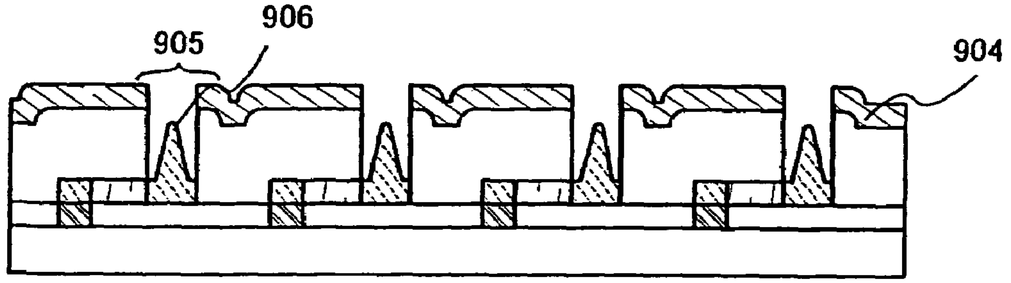

Next, as shown in FIG. 10C, a conductive film to become the stripe-shaped gate electrode 904 is formed with the use of a resist mask (not shown in the figure). After that, the gate electrode and the second insulating film that are formed on a portion on the drain region are subjected to etching to form the gate electrode 904 as well as the opening portion 905.

Next, similarly to Embodiment Mode 5, a laser beam is irradiated to the semiconductor film to form a convex portion of the semiconductor film to form the electron emission portion 906. Concerning the laser beam and conditions in irradiating the laser beam, it is possible to refer to Embodiment Mode 5 appropriately.

Figure 10D:
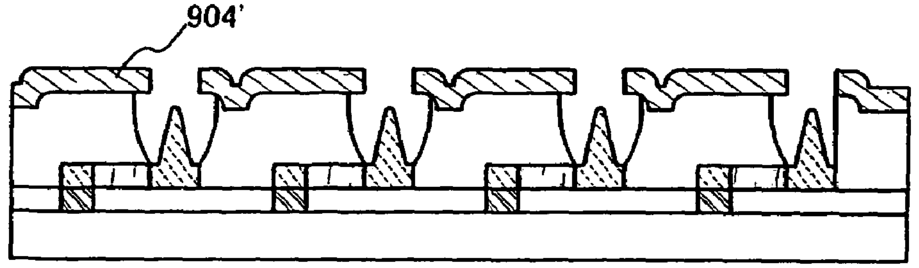

After that, as shown in FIG. 10D, it is preferable that isotropic etching such as wet etching is performed to remove a portion of the second insulating film below the gate electrode 904 to form a gate electrode 904' protruding from the second insulating film in the shape of an appentice.

It is noted that a thin film of a metal element may be deposited on a surface of the electron emission portion 906 manufactured according to the present embodiment mode, which is formed at the surface of the drain region. In this case, it is possible, as the thin film, to use a thin film including a metal element such as tungsten, niobium, tantalum, molybdenum, chromium, aluminum, copper, gold, silver, titanium, or nickel.

Although one electron emission portions is shown in the opening portion 905 in FIG. 9 as a sort of pattern diagram, and more electron emission portions may be formed.

According to the processes mentioned above, it is possible to form the field emission device on the first substrate. In order to more precisely control switching of ON/OFF of the field emission device, a switching element such as a thin film transistor or a diode may additionally be provided in each field emission device.

The first substrate formed according to the present embodiment mode and the second substrate formed according to a similar process to Embodiment Mode 4 are bonded with a sealing member, and the pressure in a portion surrounded by the first and second substrate and the sealing member is reduced to form the display panel of the field emission display device.

After that, the field emission display device is formed according to a similar process to Embodiment Mode 5.

According to the processes mentioned above, the field emission device that including the semiconductor film that has the source and drain region, the source wiring that has contact with the source region of the semiconductor film, the gate electrode, and the conical electron emission portion formed at the surface of the drain region of the semiconductor film, and the field emission display device including the field emission device is formed.

According to the present embodiment mode, it is possible to form a field emission device on a large-sized substrate without complicated processes. A field emission display device according to the present embodiment mode has an electron emission portion formed in a drain region of a switching element in each pixel. Accordingly, it is possible to form a display device with high resolution since electron emission can be controlled in each pixel.

Embodiment Mode 7

An explanation will be given with reference to FIG. 11 and FIGS. 12A to 12D on a field emission device of a triode-type FED and a field emission display device including the field emission device. The field emission device to be mentioned here includes 1) an etched semiconductor region into a desired shape, which includes source and drain regions, 2) a source electrode which has contact with the source region of the semiconductor film, 3) a gate electrode (a gate wiring) which controls the carrier concentration between the source and drain regions through an insulating film, and 4) a convex electron emission portion formed at a surface of the drain region of the semiconductor film in an opening portion of the gate electrode and the insulating film.

Figure 11:
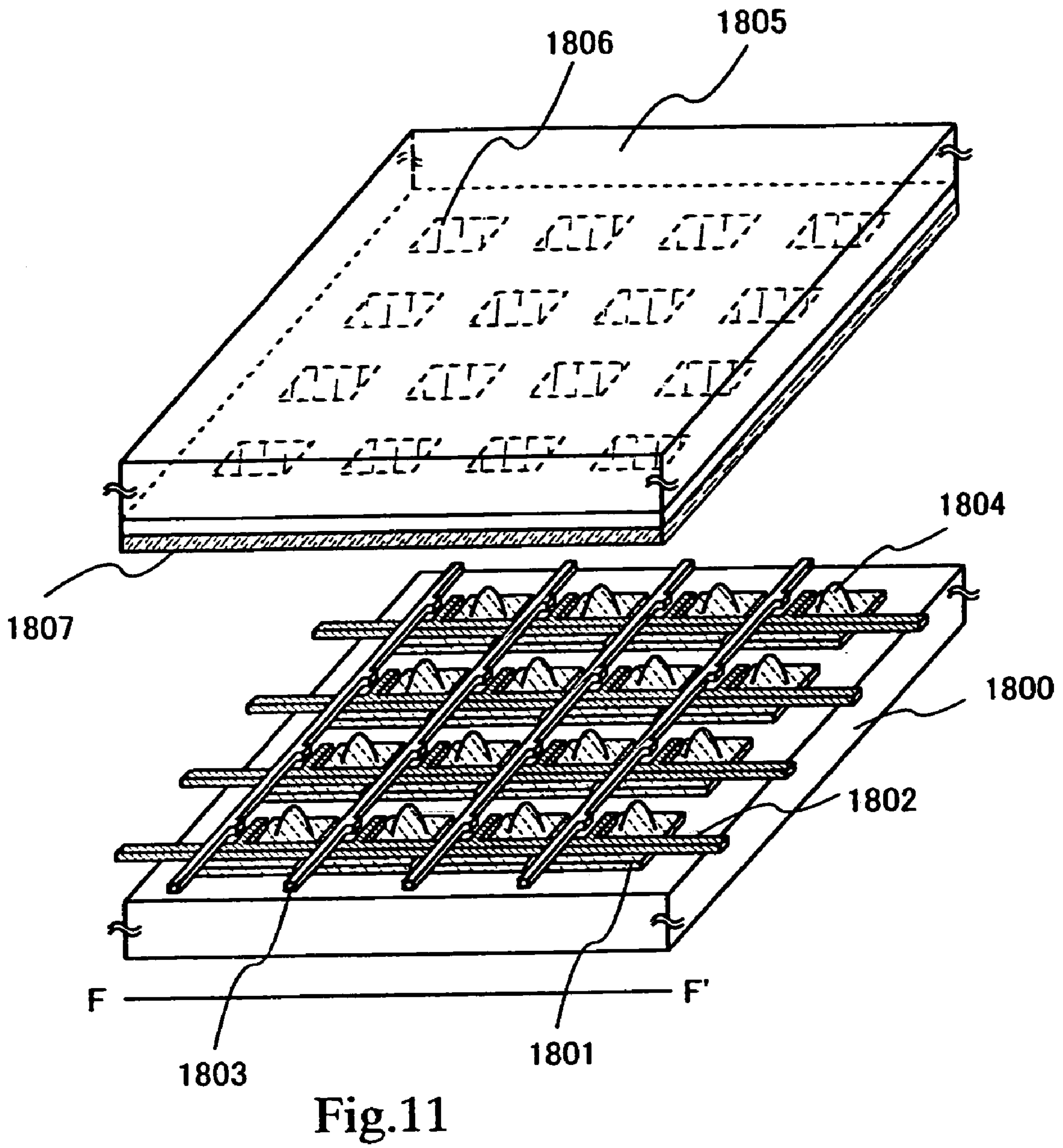
FIG. 11 is a perspective view showing a display panel of a field emission display device according to Embodiment Mode 7 of the present invention.

As shown in FIG. 11, a phosphor layer 1806 and an anode electrode 1807 are formed on a second substrate 1805 similarly to Embodiment Mode 4.

FIGS. 12A to 12D show sectional views along F-F' of FIG. 11. With reference to FIGS. 12A to 12D, a manufacturing method of the field emission device according to the present embodiment mode will be shown.

Figures 12A, 12B, 12C, 12D:
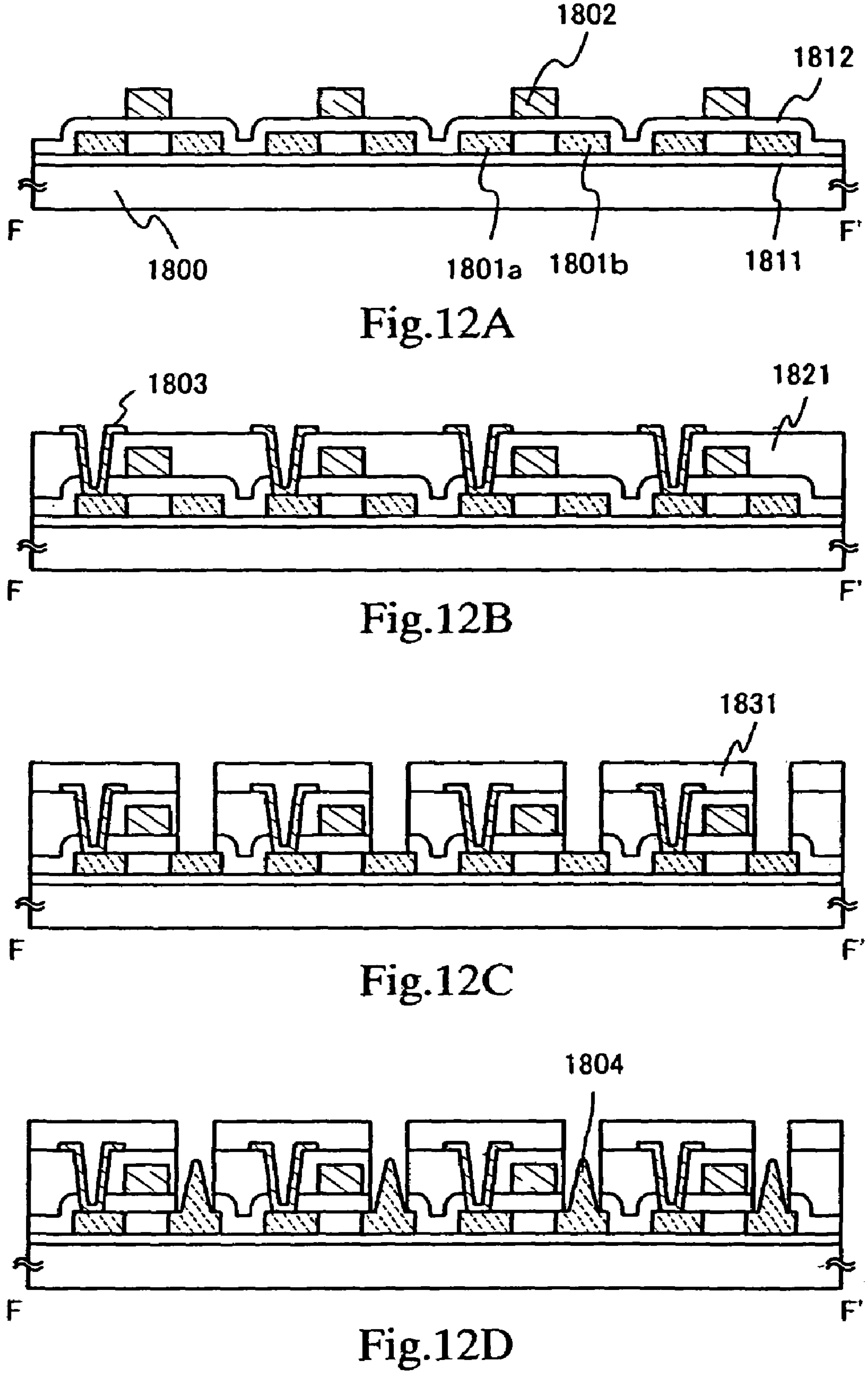
FIGS. 12A to 12D are sectional views showing a manufacturing process of the field emission device according to Embodiment Mode 7 of the present invention.

As shown in FIG. 12A, a first insulating film 1811 is formed on a first substrate 1800 similarly to Embodiment Mode 1. Then, the known method, as shown in Embodiment Mode 1, is used to form a crystalline semiconductor film, and a portion of the crystalline semiconductor film is subjected to etching to form a semiconductor region (a region 1801 in FIG. 11) in the desired shape.

Next, a second insulating film 1812 is formed with a known method. As the second insulating film 1812, a film containing silicon and oxygen as its main components such as a silicon oxide film, a silicon oxynitride film, or a silicon oxynitride film (different composition ratio) is formed.

Next, a first conductive film is formed. As the first conductive film, it is possible to form a film including the same metal element as the conductive film 603 in Embodiment Mode 4. Then, after forming a resist mask on the first conductive film, patterning is conducted to remove an unnecessary portion of the first conductive film to form a gate electrode 1802. After that, with the use of the gate electrode 1802 as a mask, a portion of the crystalline semiconductor film is doped with an impurity that imparts n-type to form source and drain regions 1801*a* and 1801*b*.

Next, as shown in FIG. 12B, a third insulating film 1821 is formed. It is possible to form the third insulating film 1821 with the use of the same material as the second insulating film 602 shown in Embodiment Mode 4.

Next, a portion of the second and third insulating films is subjected to etching, and a second conductive film is deposited. Then, the second conductive film is etched into a desired shape to form a source electrode 1803.

Next, as shown in FIG. 12C, after forming a fourth insulating film 1831 on the third insulating film 1821, a portion of the second to fourth insulating films is etched to expose a portion of the semiconductor region.

Next, similarly to Embodiment Mode 5, a laser beam is irradiated to the semiconductor film to form a convex portion of the semiconductor film to form the electron emission portion 1804, as shown in FIG. 12D. Concerning the laser beam and conditions in irradiating the laser beam, it is possible to refer to Embodiment Mode 5 appropriately.

In FIG. 11, the first to fourth insulating films 1811, 1812, 1821, and 1831, which are shown in FIGS. 12A to 12D, are omitted.

In order to more precisely control switching of ON/OFF of the field emission device, a switching element such as a thin film transistor or a diode may additionally be provided in each field emission device. Besides, a control electrode for controlling an amount of electron may be provided on the insulating film such as on the third insulating film 1821 or the fourth insulating film 1831. With the structure, it is possible to control electron emission with more stability. Although the field emission device has a top-gate structure in the present embodiment mode, there is no limitation, and it is possible to apply a bottom-bottom gate structure to form a field emission device similarly.

The first substrate formed according to the processed mentioned above and the second substrate formed according to a similar process to Embodiment Mode 4 are bonded with a sealing member, and the pressure in a portion surrounded by the first and second substrate and the sealing member is reduced to form a display panel of the field emission display device.

After that, the field emission display device is formed according to a similar process to Embodiment Mode 5.

According to the processes mentioned above, the field emission device that including the semiconductor film that has the source and drain region, the source electrode that has contact with the source region of the semiconductor film, the gate electrode, and the conical electron emission portion formed at the surface of the drain region of the semiconductor film, and the field emission display device including the field emission device is formed.

According to the present embodiment mode, it is possible to form a field emission device on a large-sized substrate without complicated processes. The field emission display device according to the present embodiment mode has an electron emission portion formed in a drain region of a switching element in each pixel. Accordingly, it is possible to form a display device with high resolution since electron emission can be controlled in each pixel.

Embodiment Mode 8

In the present embodiment mode, a field emission device that has a structure in which an electron emission portion as an electron source is simply provided on a cathode electrode without providing a gate electrode, that is, a field emission device of a diode-type FED and a display device that has the field emission device will be shown. Concretely, an explanation will be given on a field emission device in which a planar cathode electrode is formed on a whole first substrate, a planar anode electrode to which a phosphor layer is put is formed on a whole second substrate, and an electron emission portion is provided at a surface of the cathode electrode, and a manufacturing process of a display device that has the field emission device. It is noted that the electron emission portion has a whiskers shape.

Figure 15:
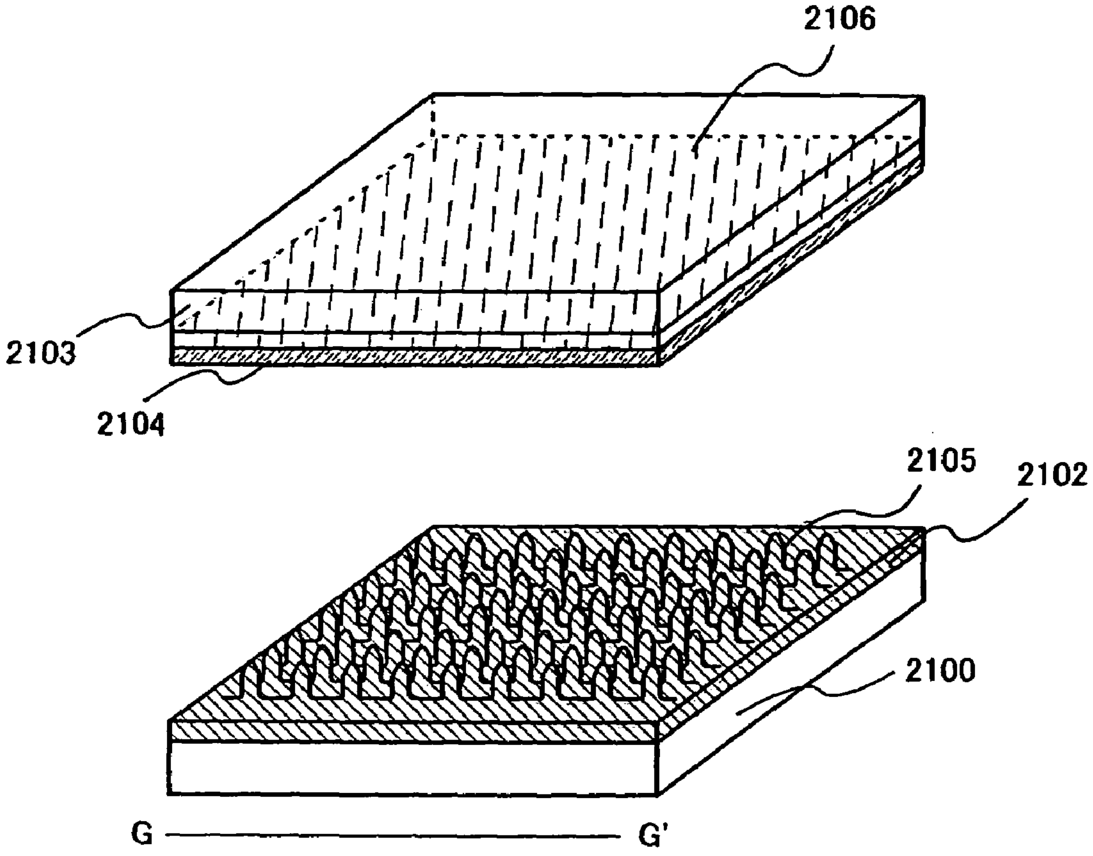
FIG. 15 is a perspective view showing a display panel of a field emission display device according to Embodiment Mode 8 of the present invention.

FIG. 15 shows a perspective view of a display panel in the present embodiment mode. A planar cathode electrode 2102 of a semiconductor film is formed over a first substrate 2100 and a planar anode electrode 2104 is formed over a second substrate 2103. At a surface of the cathode electrode, a whiskers-shaped electron emission portion 2105 is formed.

Figure 16A:
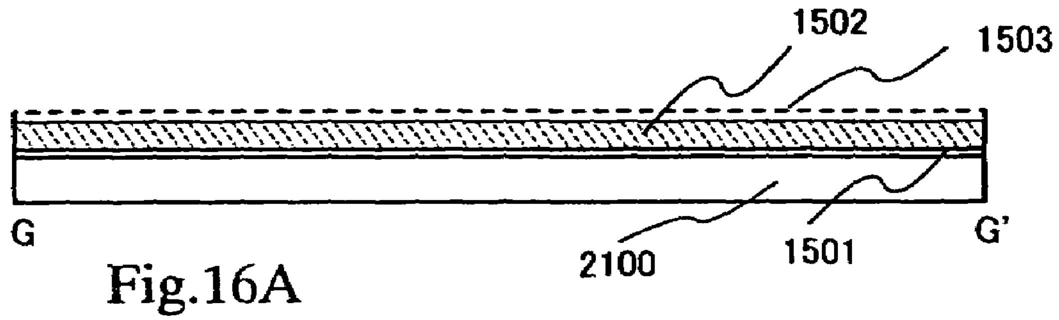
FIGS. 16A to 16C are sectional views showing a manufacturing process of the field emission device according to Embodiment Mode 8 of the present invention.
Figure 16B:
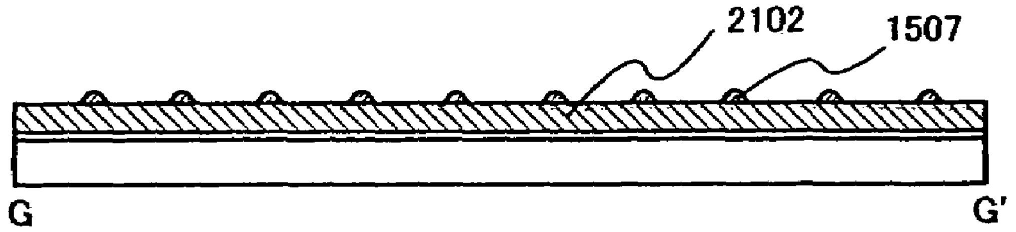
Figure 16C:
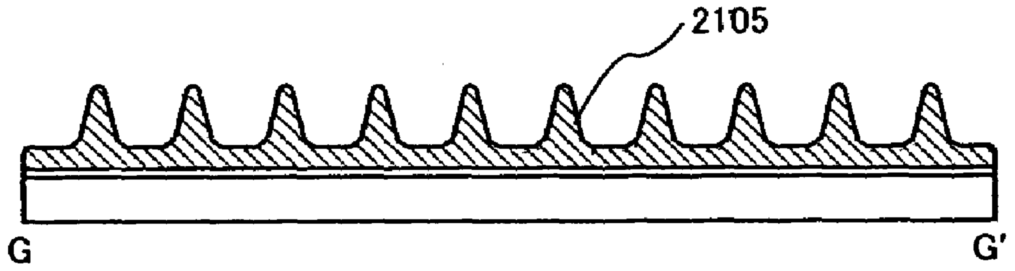

FIGS. 16A to 16C show sectional views along G-G' of FIG. 15. With reference to FIGS. 16A to 16C, a manufacturing method of the field emission device according to the present embodiment mode will be shown.

As shown in FIG. 16A, an insulating film 1501 is formed on the first substrate 2100. With the insulating film 1501, a slight amount of alkali metal such as sodium (Na), which is included in a glass substrate, can be prevented from diffusing. On the insulating film 1501, an amorphous semiconductor film 1502 is formed with a known method such as CVD or PVD. As the first substrate, it is possible to use a glass substrate, a quartz substrate, a sapphire substrate, a semiconductor substrate that has an insulating film formed on the surface thereof, and a metal substrate that has an insulating film formed on the surface thereof. Although the substrate has any size, it is possible to use a large-sized substrate such as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm.

Next, the amorphous semiconductor film 1502 is crystallized. It is possible to use a known crystallization method such as laser crystallization, rapid thermal annealing (RTA), thermal crystallization with furnace annealing, or thermal crystallization that uses a metal element for promoting crystallization. In the present embodiment mode, thermal crystallization that uses a metal element for promoting crystallization to crystallize the amorphous semiconductor film 1502. A metal element 1503 is added to the hole of the amorphous semiconductor film 1502, and heating treatment is conducted. Here, one of Au, Al, Li, Mg, Ni, Co, Pt, and Fe, is used as the metal element for promoting crystallization, and solution containing the metal element from 1 to 100 ppm, specifically, solution containing nickel of 5 ppm is applied with spin coating. After that, the heating treatment is conducted at a temperature from 500 to 650° C. for 1 to 12 hours. Instead of applying the solution including the metal element, a thin film including the metal element may be deposited. Although it is preferable that the semiconductor film has a film thickness from 0.03 to 0.3 μm, the film thickness is not limited thereto. When the heating process is conducted, the metal element or metal silicide (1507) separates out at a surface of a grain boundary (hereinafter, referred to as a triplet point) as well as the amorphous semiconductor film 1502 is crystallized to become a crystalline semiconductor film 1506 (the cathode electrode 2102), as shown in FIG. 16B. It is noted that the grain boundary may be the triplet point, quadruple point, or multiple point. It is possible to control the grain boundary with conditions in crystallization, for example, a crystallization temperature and a concentration of hydrogen in the film. Namely, when the grain boundary is controlled, it is possible to control a whiskers density, that is, a density of the electron emission portion. After the heat treatment, a laser beam is irradiated to the crystalline semiconductor film.

Next, after hydrogenation of the surface of the crystalline semiconductor film and the segregated metal element or metal silicide, gas including a semiconductor element is used to form the whiskers-shaped electron emission portion 2105 with thermal CVD or plasma CVD. There is an aggregation of the metal element in a foot or tip of the electron emission portion. In the present embodiment mode, heating in an atmosphere including silane gas of 0.1% is performed to crystallize an aggregation of the semiconductor element (silicon) in the gas phase at a surface of the metal element or the metal silicide, which functions as a catalyst, to form the whiskers-shaped electron emission portion 2105 (FIG. 16D).

It is preferable that the crystalline semiconductor film is doped with an impurity element that imparts n-type in order to enhance conductivity. As the impurity element that imparts n-type, it is possible use to an element belonging to Group 15 of the periodic table, typically, phosphorous (P) or arsenic (As).

According to the processes mentioned above, it is possible to form the whiskers-shaped electron emission portion, and also possible to form the field emission device including the cathode electrode and the whiskers-shaped electron emission portion formed at the surface of the cathode electrode.

Besides, a cathode electrode of a film including a metal element may be formed between the crystalline semiconductor film 1506 and the insulating film 1501. As a material of the cathode electrode, it is possible to use a metal element such as tungsten, niobium, tantalum, molybdenum, chromium, aluminum, copper, gold, silver, titanium, or nickel, or an alloy or a compound including the metal element (typically, nitride such as tantalum nitride or titanium nitride, silicide such as tungsten silicide, nickel silicide, molybdenum silicide).

Next, as shown in FIG. 15, a phosphor layer 2106 is formed on the second substrate 2103 with a known method, and a conductive film with a film thickness from 0.05 to 0.1 μm is formed thereon to form the anode electrode 2104. As the conductive film, a thin film including a metal element such as aluminum, nickel, or silver, or a transparent conductive film such as ITO (alloy of indium oxide-tin oxide), alloy of indium oxide-zinc oxide ($In_2O_3$—ZnO), or zinc oxide (ZnO) can be deposited with a known method. The conductive film may be processed into a desired shape according to a known photolithography process.

As the phosphor layer, there are a red phosphor layer, a blue phosphor layer, and a green phosphor layer. In the case of arranging phosphor layers of plural colors, a black matrix (BM) may be formed between phosphor layers in order to enhance contrast. The anode electrode may be formed on each phosphor layer. In the case of using a thin film including a metal element such as aluminum, nickel, or silver, or an alloy thin film including the metal element as a conductive film to become the anode electrode, light emitted form the phosphor is reflected to the side of the second substrate to enable improving luminance of a display screen.

The first and second substrates formed according to the present embodiment mode are bonded with a sealing member, and the pressure in a portion surrounded by the first and second substrate and the sealing member is reduced to form the display panel of a field emission display device.

The cathode electrode 2104 formed over the first substrate 2100 is connected to a cathode electrode driving circuit and the anode electrode 2104 formed over the second substrate 2103 is connected to an anode electrode driving circuit. It is possible to form the cathode electrode driving circuit and the anode electrode driving circuit on an extensional portion of the substrate. Alternatively, an external circuit such as an IC chip can be used. From the cathode electrode driving circuit, a relatively negative voltage is applied through the cathode electrode, and a relatively positive voltage is applied to the anode electrode from the anode electrode driving circuit. In response to the electric field generated due to the application of the voltages, an electron is emitted from the tip of the electron emission portion in accordance with quantum tunneling effect, and leaded to the side of the anode electrode. When the electron is made to collide with the phosphor layer put to the anode electrode, the phosphor layer is exited to emit light, and then a display can be obtained.

According to the processes mentioned above, the field emission display device is formed.

According to the processes mentioned above, it is possible to form a field emission device including a cathode electrode and a whisker-shaped electron emission portion formed on at a surface of the cathode electrode, and a field emission display device including the field emission device.

According to the present embodiment mode, it is possible to form a field emission device on a large-sized substrate without complicated processes. Further, according to the present embodiment mode, it becomes possible to control a density of an electron emission portion formed at a grain boundary since the grain boundary can be controlled with conditions in crystallizing a semiconductor film. Furthermore, it is possible to manufacture a surface light source of a large-sized liquid crystal display device or to an area-colored display device to become a device for electric spectaculars without complicated processes.

Embodiment Mode 9

In the present embodiment mode, another manufacturing process of a field emission device of a diode-type FED, which is similar to the field emission device in Embodiment Mode 8 will be shown.

FIGS. 17A to 17D are sectional views along G-G' of FIG. 15, similar to FIGS. 16 A to 16C. Similarly to Embodiment Mode 8, an insulating film 1401 and an amorphous semiconductor film 1402 are sequentially formed on a substrate 1400. Then, the amorphous semiconductor film 1402 is crystallized. In the embodiment mode, laser crystallization is used as a crystallization method. A laser beam 1403 emitted from a gas laser oscillator, a solid laser oscillator, or a metal laser oscillator is irradiated to the amorphous semiconductor film 1402 to form a crystalline semiconductor film 1404. As the laser beam 1403, a continuous wave or a pulse oscillation laser beam can be used.

Figure 17A:
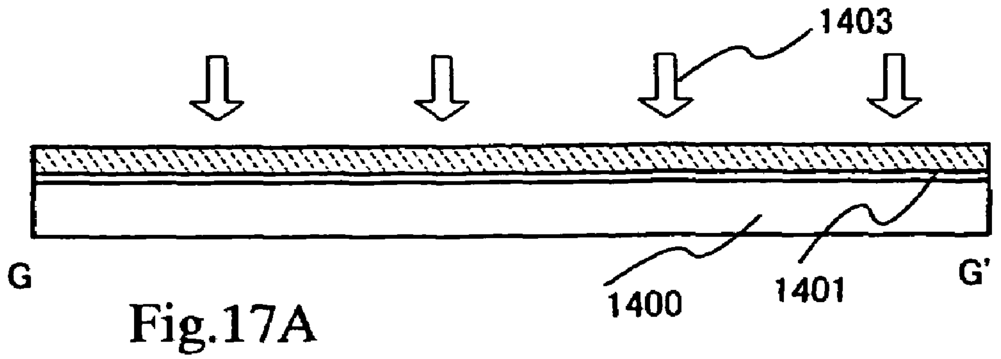
FIGS. 17A to 17D are sectional views showing a manufacturing process of a field emission device according to Embodiment Mode 9 of the present invention.
Figure 17B:
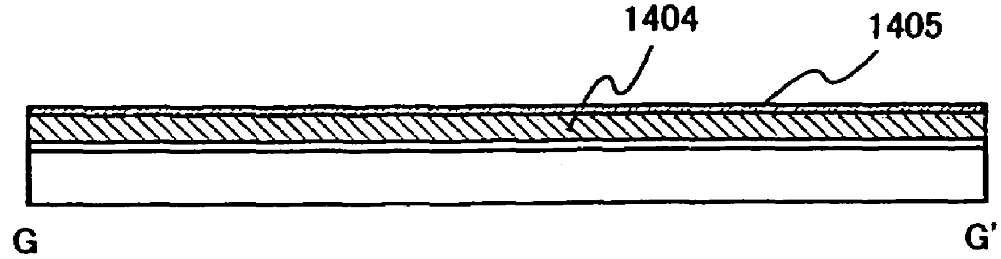
Figure 17C:
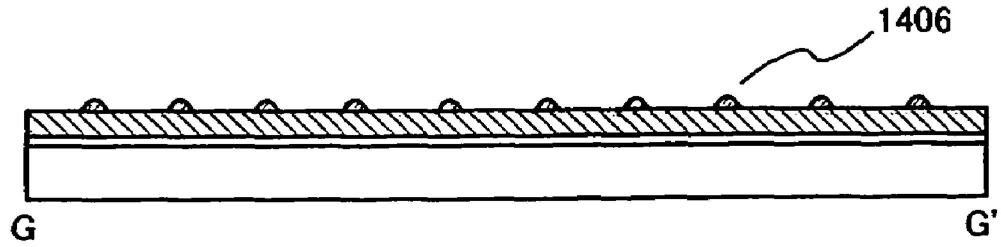
Figure 27:
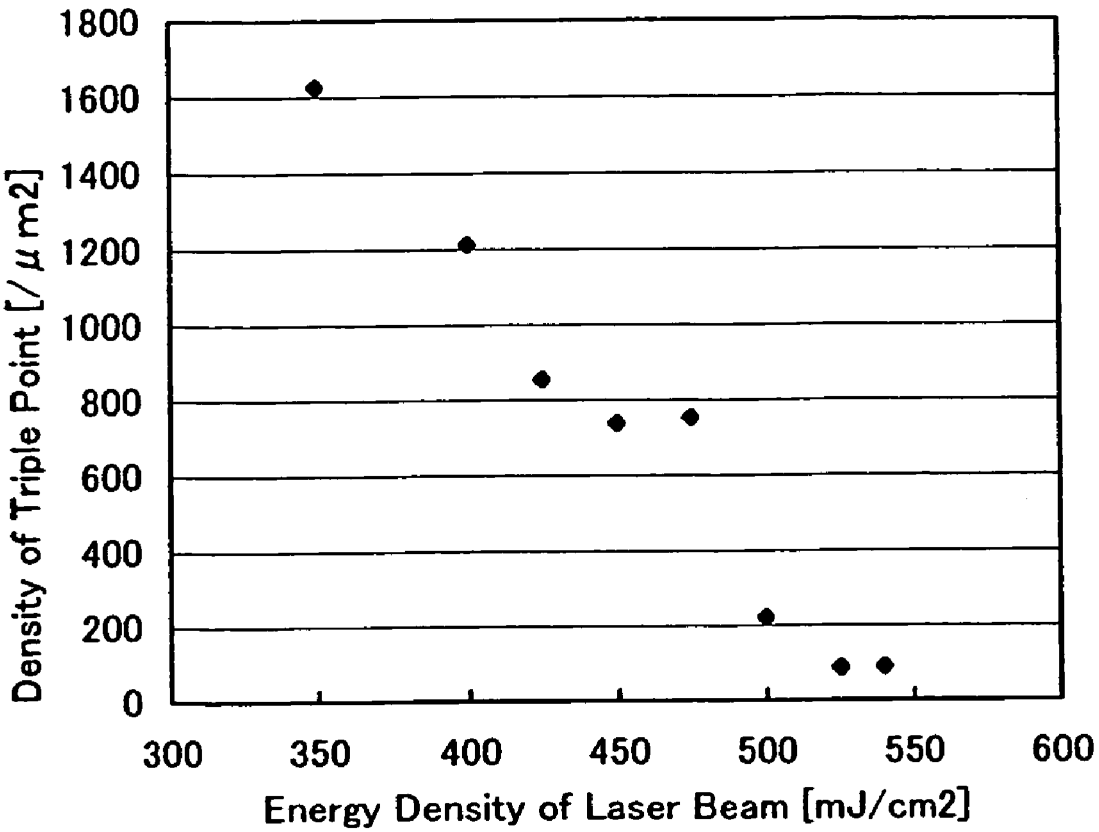
FIG. 27 is a diagram showing a density of the triple point.
Figure 28A:
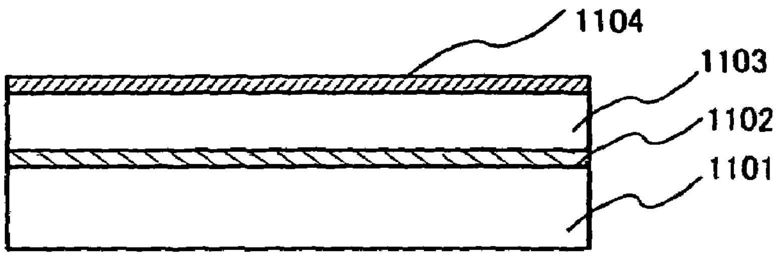
FIGS. 28A to 28D are diagrams showing an example of conventional manufacturing method of a field emission device.
Figure 28B:
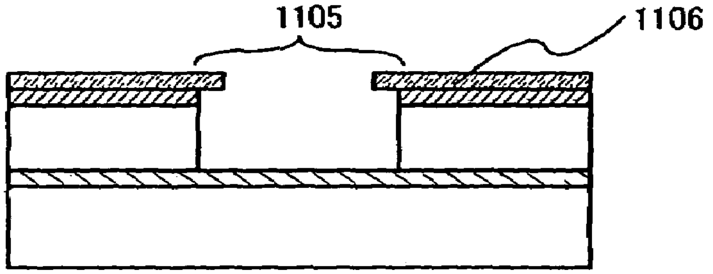
Figure 28C:
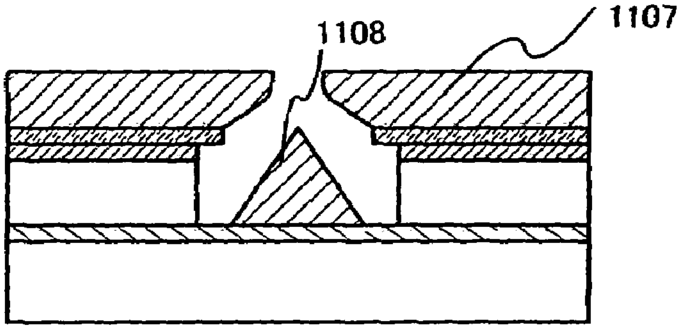
Figure 28D:
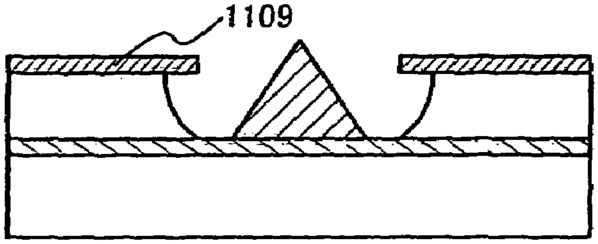

Next, as shown in FIG. 17B, a metal element is added to the crystalline semiconductor film 1404. In the present embodiment mode, a thin film 1405 including the metal element is formed on the crystalline semiconductor film. As the metal element, one of Au, Al, Li, Mg, Ni, Co, Pt, and Fe, can be used. In the present embodiment mode, the thin film 1405 including the metal element is deposited with sputtering to have a thickness from 2 to 5 nm. After that, heating at a temperature from 400 to 600° C. is conducted, which makes the metal element or metal silicide in the thin film 1405 segregate at a surface of a grain boundary of the crystalline semiconductor film (a region 1406 in FIG. 17C). It is noted that a grain boundary of a crystalline semiconductor film formed with a laser beam has a different density depending on a condition in laser irradiation, as shown in FIG. 27. FIG. 27 shows a density of a triple point in the case of irradiating XeCl laser to an amorphous silicon film with a thickness of 50 nm. It is understood that the triple point has a different density depending on an energy density of the laser beam. With the control above, it is possible to control a density of whiskers of an electron emission portion.

Figure 17D:
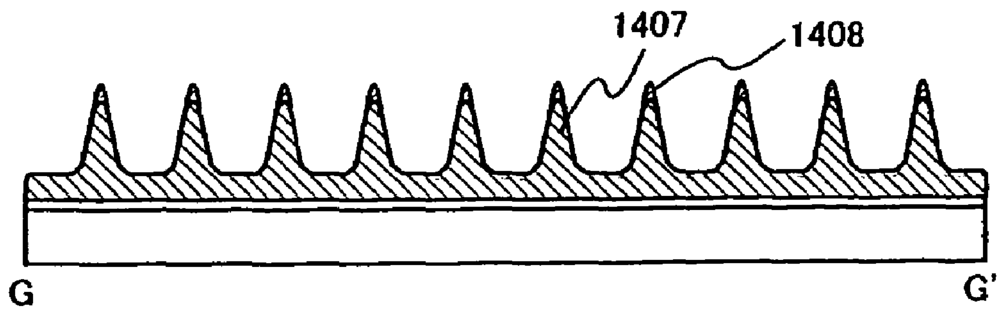

After hydrogenation of the surface of the crystalline semiconductor film and the segregated metal element or metal silicide, gas including a semiconductor element is used to form the whiskers shaped electron emission portion with thermal CVD or plasma CVD. In the present embodiment mode, heating at a temperature from 400 to 600° C. in an atmosphere including silane gas of 0.1% is performed to crystallize an aggregation of the semiconductor element (silicon) in the gas phase at a surface of the segregated metal element or the metal silicide to form the whiskers-shaped semiconductor film 1407. There is an aggregation 1408 of the metal element in a tip of the electron emission portion (FIG. 17D).

According to the processes mentioned above, it is possible to form the field emission device including the cathode electrode and the whiskers-shaped electron emission portion formed at the surface of the cathode electrode. According to the present embodiment mode, it becomes possible to control the density of the electron emission portion formed at the grain boundary since the grain boundary can be controlled with conditions in crystallizing a semiconductor film.

It is preferable that the crystalline semiconductor film is doped with an impurity element that imparts n-type in order to enhance conductivity. As the impurity element that imparts n-type, it is possible to use an element belonging to Group 15 of the periodic table, typically, phosphorous (P) or arsenic (As).

In the present embodiment mode also, a cathode electrode of a film including a metal element may be formed between the semiconductor film and the insulating film, similarly to Embodiment Mode 8.

According to the processes mentioned above, it is possible to form a field emission device including a cathode electrode and a whiskers-shaped electron emission portion formed at a surface of the cathode electrode.

According to the present embodiment mode, it is possible to form a field emission device on a large-sized substrate without complicated processes. In addition, it becomes possible to control a density of an electron emission portion formed at a grain boundary since the grain boundary can be controlled with conditions in crystallizing a semiconductor film.

Embodiment Mode 10

Figure 18A:
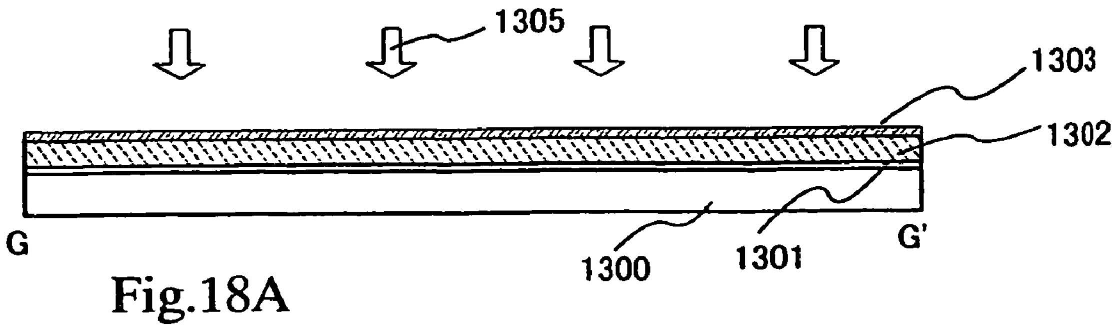
FIGS. 18A to 18C are sectional views showing a manufacturing process of a field emission device according to Embodiment Mode 10 of the present invention.
Figure 18B:
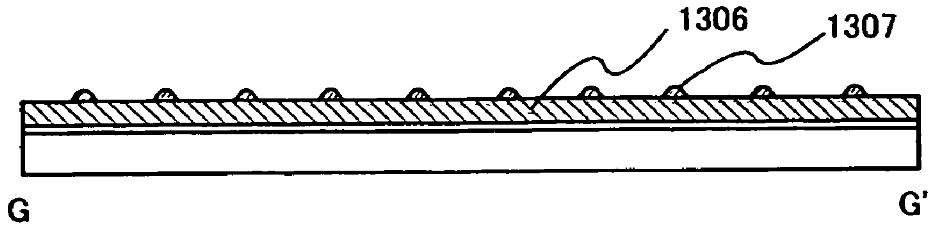
Figure 18C:
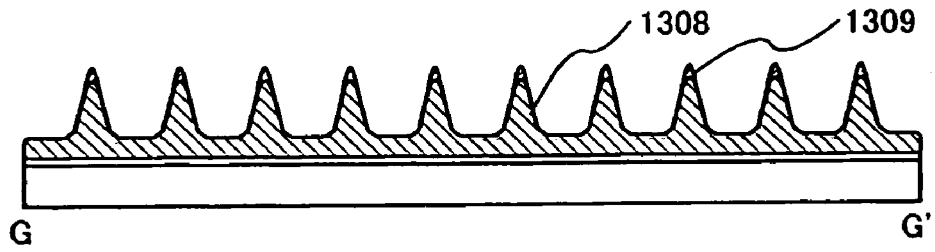

In the present embodiment mode, similarly to Embodiment Modes 8 and 9, a manufacturing method of a filed emission device of a diode-type FED will be shown with the use of FIG. 18A to 18C.

FIGS. 18A to 18C are sectional views along G-G' of FIG. 15, similar to FIGS. 16 A to 16C and 17A to 17D. As shown in FIG. 18A, an amorphous semiconductor film 1302 is formed after forming an insulating film 1301 on a substrate 1300 similarly to Embodiment Mode 8. Then, a metal element is added to the amorphous semiconductor film 1302. In the present embodiment mode, plasma CVD is used to form a metal thin film 1303 specifically, a gold thin film with a thickness from 2 to 5 nm on a surface of the amorphous semiconductor film 1302. As the metal element, it is possible to use Au, Al, Li, Mg, Ni, Co, Pt, and Fe.

Next, a laser beam 1305 is irradiated to the amorphous semiconductor film to crystallize the amorphous semiconductor film to form a crystalline semiconductor film 1306. At this point, the metal element or metal silicide 1307 is segregated at a surface of a grain boundary (triple point) of the crystalline semiconductor film (FIG. 18B). As the laser beam 1305, the same laser beam as the laser beam 1301 in Embodiment Mode 9 can be used.

Next, after hydrogenation of the surface of the crystalline semiconductor film 1306 and the segregated metal element or metal silicide 1307, gas including a semiconductor element is used to form the whiskers-shaped electron emission portion with thermal CVD or plasma CVD. In the present embodiment mode, heating in an atmosphere including silane gas of 0.1% is performed to crystallize an aggregation of the semiconductor element (silicon) in the gas phase at a surface of the segregated metal element or the metal silicide, which functions as a catalyst, to form the whiskers-shaped crystalline semiconductor film 1308. There is an aggregation 1309 of the metal element in a tip of the electron emission portion (FIG. 18C).

It is preferable that the crystalline semiconductor film is doped with an impurity element that imparts n-type in order to enhance conductivity. As the impurity element that imparts n-type, it is possible use to an element belonging to Group 15 of the periodic table, typically, phosphorous (P) or arsenic (As).

According to the processes mentioned above, it is possible to form the whiskers-shaped electron emission portion.

In the present embodiment mode also, a cathode electrode of a film including a metal element may be formed between the semiconductor film and the insulating film, similarly to Embodiment Mode 8.

In addition, it is possible to manufacture a display panel with the use of the substrate manufactured according to the present embodiment mode as a first substrate, similarly to Embodiment Mode 8.

According to the processes mentioned above, it is possible to form a field emission device including a cathode electrode and a whiskers-shaped electron emission portion formed at a surface of the cathode electrode. According to the present embodiment mode, it becomes possible to control a density of an electron emission portion formed at a grain boundary since the grain boundary can be controlled with conditions in crystallizing a semiconductor film. In addition, it is possible to form a field emission device on a large-sized substrate without complicated processes.

Embodiment Mode 11

In the present embodiment mode, similarly to Embodiment Modes 8 to 10, a field emission device of a diode-type FED and a display device that has the field emission device will be shown. Concretely, an explanation will be given with reference, to FIG. 19 and FIGS. 20A to 20C, on a field emission device in which an electron emission portion is formed at an intersection of a stripe-shaped cathode electrode formed over a first substrate and a stripe-shaped anode electrode formed over a second substrate, and a field emission display device including the field emission device. The manufacturing process of the electron emission portion, mentioned in Embodiment Mode 8, is applied to a manufacturing process of the electron emission portion in the present embodiment mode, and the electron emission portion has a whiskers shape. The process in Embodiment Modes 9 or 10 may be applied.

Figure 19:
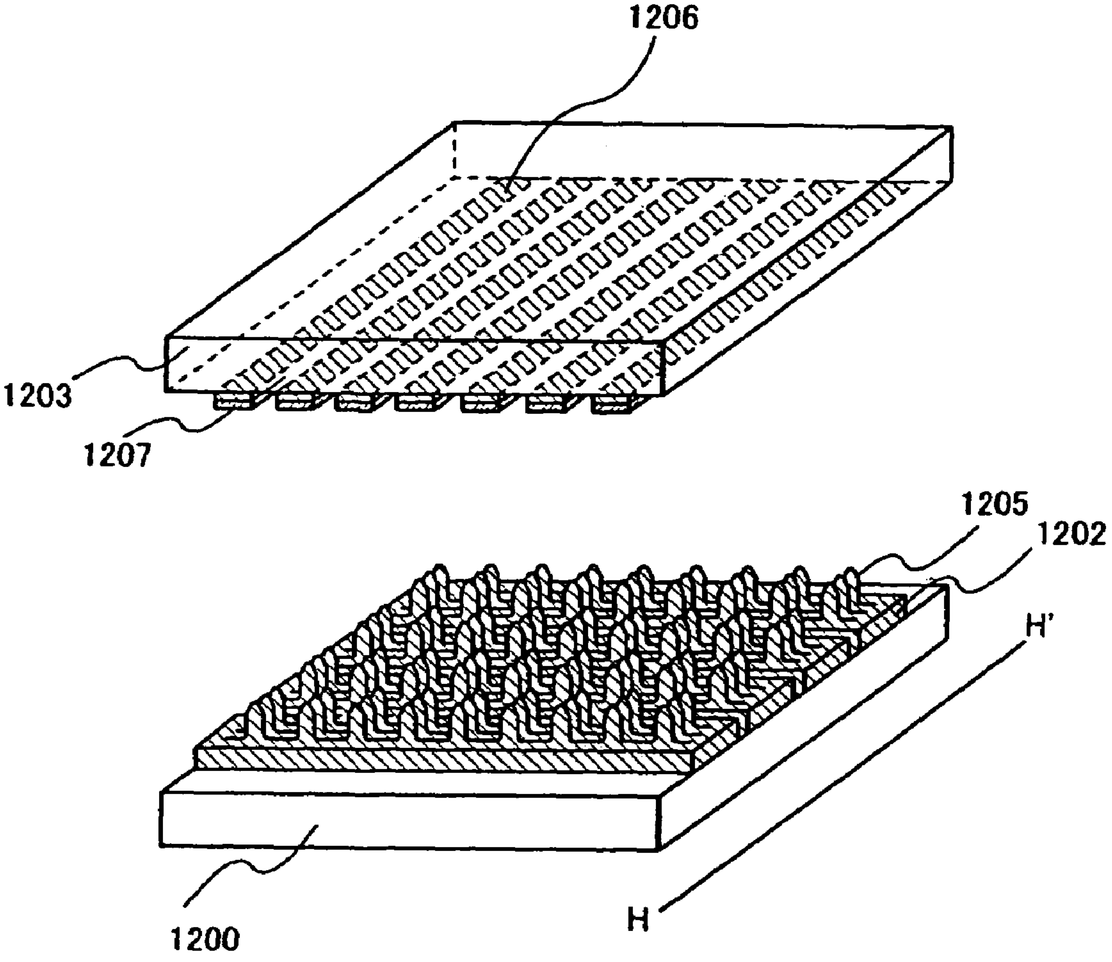
FIG. 19 is a perspective view showing a display panel of a field emission display device according to Embodiment Mode 11 of the present invention.

FIG. 19 shows a perspective view of a display panel in the present embodiment mode. An electron emission portion 1205 is formed at an intersection, through a distance, of a stripe-shaped cathode electrode 202 of a semiconductor film formed over a first substrate 1200 and a stripe-shaped anode electrode 1207 formed over a second substrate. Although one whiskers-shaped electron emission portion is formed at an intersection of the cathode electrode and the anode electrode in FIG. 19 as a sort of pattern diagram, plural electron emission portions may be formed.

Figure 20A:
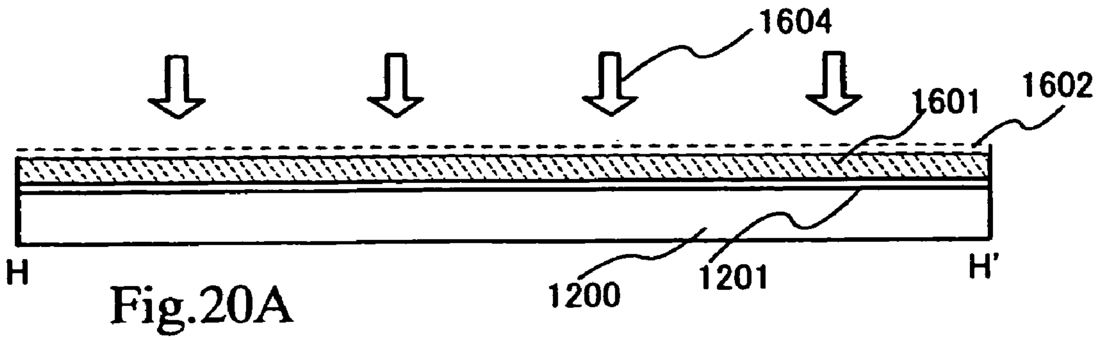
FIGS. 20A to 20C are sectional views showing a manufacturing process of the field emission device according to Embodiment Mode 11 of the present invention.
Figure 20B:
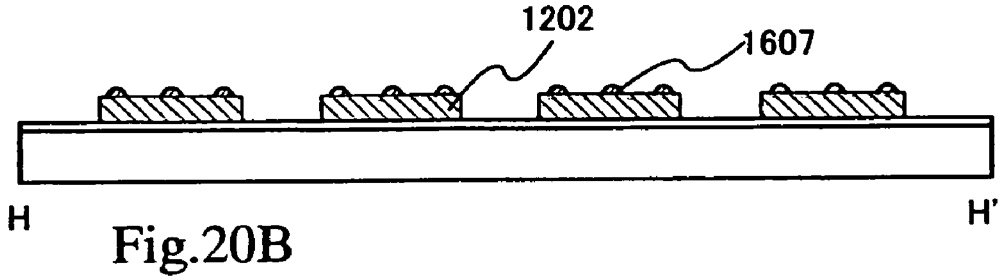
Figure 20C:
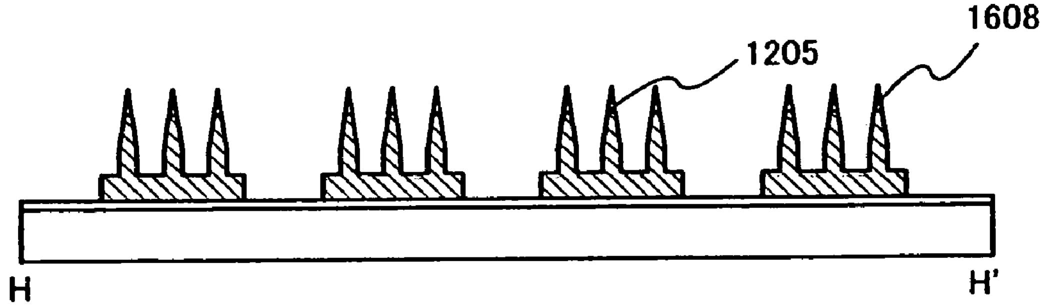

FIGS. 20A to 20C are sectional views along H—H' of FIG. 19. With reference to FIGS. 20A to 20C, a manufacturing method of the cathode electrode and the electron emission portion of the present embodiment mode will be shown. It is noted that the same numerals are used to show the same portions as those in FIG. 19.

As shown in FIG. 20A, an insulating film 1201 is formed on a first substrate 1200, a known method such as CVD or PVD is used to form an amorphous semiconductor film 1601, and then CVD is used to form a metal thin film 1602 with a thickness from 2 to 5 nm, similarly to Embodiment Mode 10. As the metal thin film, it is possible to form a film including Au, Al, Li, Mg, Ni, Co, Pt, and Fe.

After that, a laser beam is irradiated to form a crystalline semiconductor film. At this point, the metal element or metal silicide 1607 is segregated at a surface of a grain boundary (triple point) of the crystalline semiconductor film (FIG. 20B). As the laser beam, the same laser beam as the laser beam 1301 in Embodiment Mode 9 can be used.

Next, the crystalline semiconductor film is subjected to etching to form a stripe-shaped crystalline semiconductor film 1202. Alternatively, after etching the crystalline semiconductor film into the stripe shape, the laser beam is irradiated to form the grain boundary.

Next, after hydrogenation of the surface of the crystalline semiconductor film 1202 and the segregated metal element or metal silicide 1607, gas including a semiconductor element is used to form the whiskers-shaped electron emission portion with thermal CVD or plasma CVD. In the present embodiment mode, heating at a temperature from 400 to 600° C. in an atmosphere including silane gas of 0.1% is performed to react the metal element or metal silicide with the semiconductor element in the gas phase to make the semiconductor element separate out in the whiskers shape at a surface of the grain boundary (triple point). There is an aggregation 1608 of the metal element in a tip of the electron emission portion (FIG. 20C).

It is preferable that the semiconductor film is doped with an impurity element that imparts n-type in order to enhance conductivity. As the impurity element that imparts n-type, it is possible to use an element belonging to Group 15 of the periodic table, typically, phosphorous (P) or arsenic (As).

As shown in FIG. 19, a phosphor layer 1206 is formed on the second substrate 1203 with a known method, and a conductive film with a film thickness from 0.05 to 0.1 μm is formed thereon to form the striped-shaped anode electrode 1207. As the conductive film, the conductive film in Embodiment Mode 8 can be applied.

As the phosphor layer, there are a red phosphor layer, a blue phosphor layer, and a green phosphor layer, and one pixel includes a set of red, blue, green phosphor layers. It is preferable that a black matrix (BM) is formed between phosphor layers in order to enhance contrast. The anode electrode may be formed on each phosphor layer, or over a pixel including red, blue, green phosphor layers.

The first and second substrates formed according to the present embodiment mode are bonded with a sealing member, and the pressure in a portion surrounded by the first and second substrate and the sealing member is reduced to form the display panel of the field emission display device.

In the present embodiment mode, a passive driving method is applied. The cathode electrode 1202 formed over the first substrate 1200 is connected to a cathode electrode driving circuit and the anode electrode 1207 formed over the second substrate 1203 is connected to an anode electrode driving circuit. It is possible to form the cathode electrode driving circuit and the anode electrode driving circuit on an extensional portion of the substrate. Alternatively, an external circuit such as an IC chip can be used. From the cathode electrode driving circuit, a relatively negative voltage is applied through the cathode electrode, and a relatively positive voltage is applied to the anode electrode from the anode electrode driving circuit. In response to the electric field generated due to the application of the voltages, an electron is emitted form the tip of the electron emission portion in accordance with quantum tunneling effect, and leaded to the side of the and electrode. When the electron is made to collide with the phosphor layer put to the anode electrode, the phosphor layer is exited to emit light, and then a display can be obtained.

According to the processes mentioned above, the field emission display device is formed.

According to the processes mentioned above, it is possible to form a field emission device including a cathode electrode and a whiskers-shaped electron emission portion formed at a surface of the cathode electrode, and a field emission display device including the field emission device. According to the present embodiment mode, it becomes possible to control a density of an electron emission portion formed at a grain boundary since the grain boundary can be controlled with conditions in crystallizing a semiconductor film. In addition, it is possible to form a field emission device on a large-sized substrate without complicated processes.

Embodiment Mode 12

In the present embodiment mode, an explanation will be given with reference to FIG. 21 and FIGS. 22A to 22E on a field emission device of a triode-type FED and a field emission display device including the field emission device. The field emission device to be mentioned in the present embodiment mode includes 1) an etched cathode electrode into the shape of a stripe and formed of a semiconductor film with n-type conductivity, 2) a gate electrode intersecting with the cathode electrode through an insulating film, and 3) a convex electron emission portion formed on a surface of the cathode electrode in an opening portion of the gate electrode and the insulating film. Although the manufacturing process of the electron emission portion, mentioned in Embodiment Mode 8, is applied to a manufacturing process of the electron emission portion in the present embodiment mode, the process in Embodiment Modes 9 or 10 may be applied. In this case, the electron emission portion has a whiskers shape.

Figure 21:
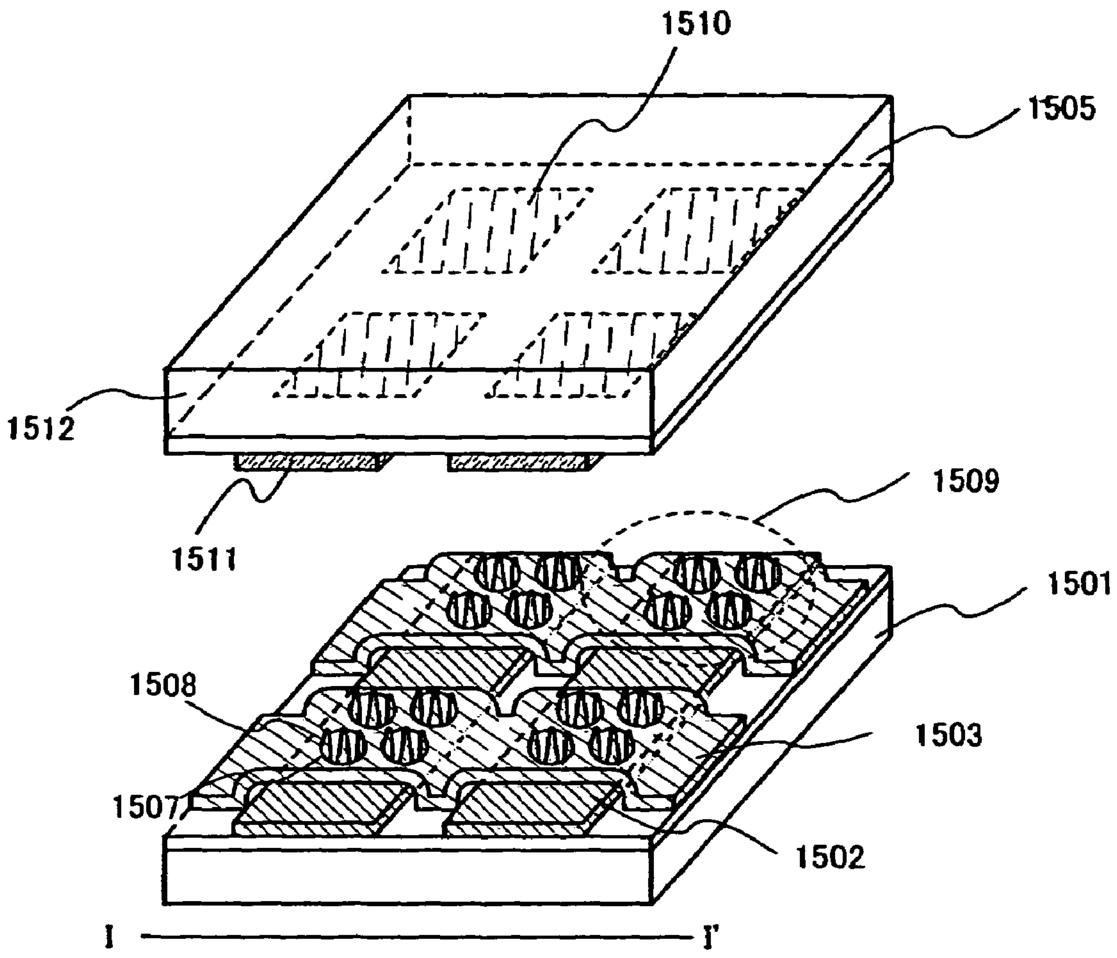
FIG. 21 is a perspective view showing a display panel of a field emission display device according to Embodiment Mode 12 of the present invention.

FIG. 21 shows a perspective view of a display panel in the present embodiment mode. Over a first substrate 1501, a stripe-shaped cathode electrode 1502 of a semiconductor film and a stripe-shaped gate electrode 1503 that is orthogonal to the cathode electrode are formed. The gate electrode is formed over the cathode electrode with an insulating film (not shown in the figure) therebetween. At an intersection of the cathode electrode and the gate electrode, an opening portion 1507 is formed, and a whiskers-shaped electron emission portion 1508 is formed at a surface of the cathode electrode in the opening portion 1507. On a second substrate 1505, a phosphor layer 1510 and an anode electrode 1511 are formed.

FIGS. 22A to 22E show sectional views along I-I' of FIG. 21. With reference to FIGS. 22A to 22E, a manufacturing method of the field emission device according to the present embodiment mode will be shown.

Figure 22A:
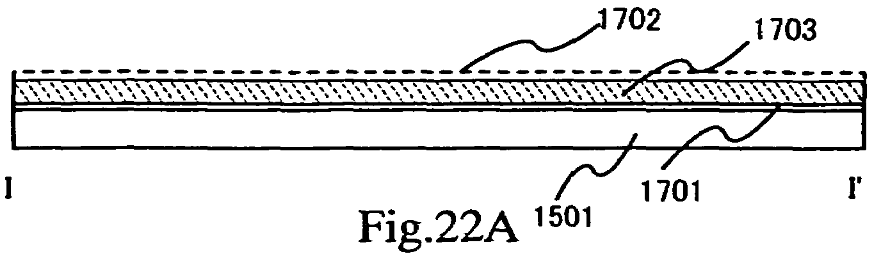
FIGS. 22A to 22E are sectional views showing a manufacturing process of the field emission device according to Embodiment Mode 12 of the present invention.

As shown in FIG. 22A, a first insulating film 1701 is formed on the first substrate 1501 similar to Embodiment Mode 8. With the first insulating film 1701, a slight amount of alkali metal, which is included in a glass substrate, can be prevented from diffusing. On the first insulating film 1701, an amorphous semiconductor film 1703 is formed with a known method such as CVD or PVD. Although it is preferable that the semiconductor film has a film thickness from 0.03 to 0.3 μm at this point, the film thickness is not limited thereto. Then, solution including one of Au, Al, Li, Mg, Ni, Co, Pt, and Fe is applied to a surface of the amorphous semiconductor film 1703. After that, heat treatment at a temperature from 500 to 650° C. is conducted to form a crystalline semiconductor film.

Figure 22B:
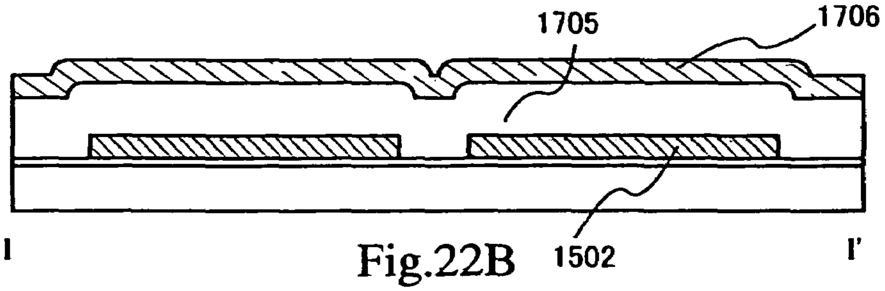

Then, after a resist mask is formed on a portion to form a cathode electrode according to a known photolithography process, a portion of the crystalline semiconductor film is etched to form a stripe-shaped crystalline semiconductor film 1502 as shown in FIG. 22B, which functions as a cathode electrode.

Next, a second insulating film 1705 is formed on the crystalline semiconductor film 1502 as the cathode electrode. As a material of the second insulating film 1705, the materials in Embodiment Mode 4 can be used.

Next, the semiconductor film is doped with an impurity element that imparts n-type in order to enhance conductivity. As the impurity element that imparts n-type, it is possible use to an element belonging to Group 15 of the periodic table, typically, phosphorous (P) or arsenic (As). The doping with the n-type impurity may be performed before forming the second insulating film.

Next, a conductive film 1706 is formed. As a material of the conductive film 1706, the materials in Embodiment Mode 4 can be used. After forming a resist mask on the conductive film 1706, patterning is conducted to remove an unnecessary portion of the conductive film 1706 to form a stripe-shaped gate electrode.

Figure 22C:
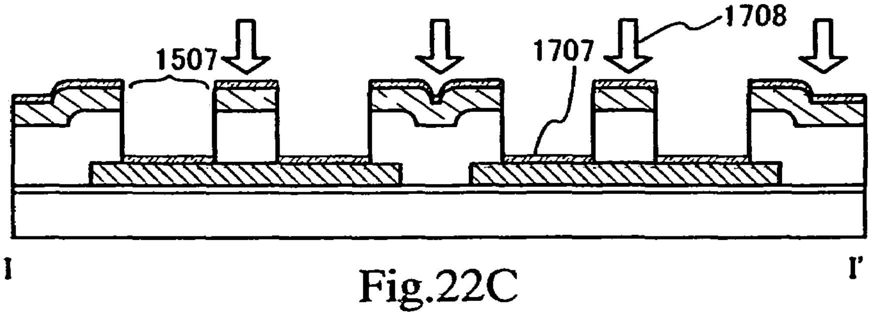

Next, as shown in FIG. 22C, the opening portion 1507 is formed in a region where the stripe-shaped cathode electrode is intersected with the stripe-shaped gate electrode through the second insulating film 1705. After forming a resist mask into a desired shape, the stripe-shaped gate electrode and the second insulating film are etched into a shape to expose the semiconductor film to form the opening portion 1507. In this process, the crystalline semiconductor film is subjected to over etching in order to avoid the second insulating film from remaining. Accordingly, the metal element or metal silicide at a surface of the crystalline semiconductor film (not shown in the figure) is removed.

Figure 22D:
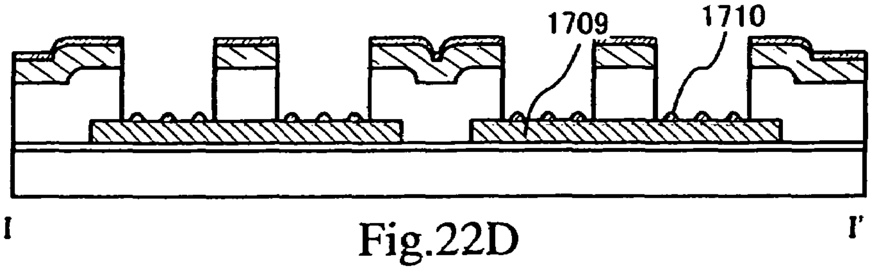

Next, a metal thin film 1707 including a metal element of Au, Al, Li, Mg, Ni, Co, Pt, and Fe, which has a thickness from 2 to 5 nm, is formed on the surface of the crystalline semiconductor film. In the present embodiment mode, a thin film including gold is formed. After that, it makes the metal element or metal silicide 1710 separate out at a grain boundary (triple point) to irradiate a laser beam (FIG. 22D).

Figure 22E:
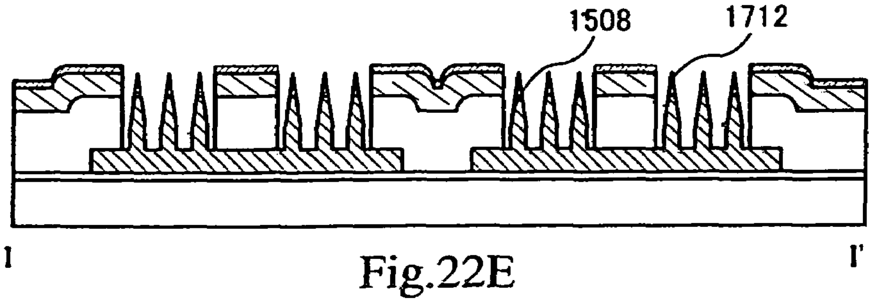

Next, after hydrogenation of the surface of the crystalline semiconductor film and the metal element or metal silicide at the grain boundary, gas including a semiconductor element is used to form the whiskers-shaped electron emission portion with thermal CVD or plasma CVD, as shown in FIG. 22E. In the present embodiment mode, heating at a temperature from 400 to 600° C. in an atmosphere including silane gas of 0.1% is performed to react the metal element or metal silicide with the semiconductor element in the gas phase, and the whiskers-shaped crystalline semiconductor film 1508 is formed. There is an aggregation 1712 of the metal element in a tip of the electron emission portion.

In FIG. 21, although four (2×2) opening portions are formed at an intersection 1509 of the cathode electrode and the gate electrode, one or plural opening portions may be formed.

As a cathode electrode, a stripe-shaped film including a metal element, which has contact with the semiconductor film, may be formed between the semiconductor film 1502 and the first insulating film 1701. As a material of the cathode electrode, it is possible to use the materials in Embodiment Mode 8.

According to the processes mentioned above, it is possible to form a field emission device including a whiskers-shaped electron emission portion formed over a first substrate.

As shown in FIG. 21, the phosphor layer 1510 is formed on the second substrate 1505 with a known method, and the anode electrode 1511 with a film thickness from 0.05 to 0.1 μm is formed thereon. As the anode electrode 1511, a thin film including a metal element such as aluminum, nickel, or silver, or a transparent conductive film such as ITO (alloy of indium oxide-tin oxide), alloy of indium oxide-zinc oxide ($In_2O_3$—ZnO), or zinc oxide (ZnO) can be deposited with a known method. In the present embodiment mode, the anode electrode may have a stripe shape, a rectangular matrix shape, or a sheet shape. As the phosphor layer, there are a red phosphor layer, a blue phosphor layer, and a green phosphor layer, and one pixel includes a set of red, blue, green phosphor layers. In order to enhance contrast, it is preferable to form a black matrix 1512 between phosphor layers. In the case of using a thin film including a metal element such as aluminum, nickel, or silver, or an alloy thin film including the metal element as a conductive film to become the anode electrode, light emitted form the phosphor is reflected to the side of the second substrate to enable improving luminance of a display screen.

The first and second substrates formed according to the present embodiment mode are bonded with a sealing member, and the pressure in a portion surrounded by the first and second substrate and the sealing member is reduced to form the display panel of the field emission display device.

In the present embodiment mode, a passive driving method is applied. The cathode electrode 1502 is connected to a cathode electrode driving circuit, the gate electrode 1503 is connected to a gate electrode driving circuit, and the anode electrode 1511 is connected to an anode electrode driving circuit. It is possible to form the cathode electrode driving circuit, the gate electrode driving circuit, and the anode electrode driving, circuit on an extensional portion of the substrate. Alternatively, an external circuit such as an IC chip can be used. From the cathode electrode driving circuit, a relatively negative voltage (0 kV, for example) is applied through the cathode electrode, and a relatively positive voltage (50 V, for example) is applied to the gate electrode from the gate electrode driving circuit. In response to the electric field generated due to the application of the voltages, an electron is emitted from the tip of the convex portion in accordance with quantum tunneling effect. From the anode electrode driving circuit, a higher voltage (5 kV, for example) than the positive voltage applied to the gate electrode is applied to lead the electron emitted from the electron emission portion to the phosphor layer put to the anode electrode. When the electron is made to collide with the phosphor layer, the phosphor layer is exited to emit light, and then a display can be obtained. In the present embodiment mode, it is also possible to form the cathode electrode driving circuit and the gate electrode driving circuit together with the field emission device.

According to the processes mentioned above, the field emission display device is formed.

According to the present embodiment mode, it is possible to form a field emission device on a large-sized substrate without complicated processes. In addition, it becomes possible to control a density of an electron emission portion formed at a grain boundary since the grain boundary can be controlled with conditions in crystallizing a semiconductor film.

Embodiment Mode 13

In the present embodiment mode, an explanation will be given with reference to FIG. 23 and FIGS. 24A to 24E on a field emission device of a triode-type FED and a field emission display device including the field emission device. The field emission device to be mentioned in the present embodiment mode includes 1) an etched semiconductor film into a desired shape, which includes source and drain regions, 2) an etched source wiring in the shape of a stripe, which has contact with the source region of the semiconductor film, 3) a gate electrode intersecting with the source wiring through an insulating film, which controls the carrier concentration between the source and drain regions of the semiconductor film, and 4) a convex electron emission portion, that is, a whiskers-shaped electron emission portion, formed at a surface of the drain region of the semiconductor film in an opening portion of the gate electrode and the insulating film. In addition, a cathode electrode of the field emission device includes at least the drain region in the present embodiment.

Figure 23:
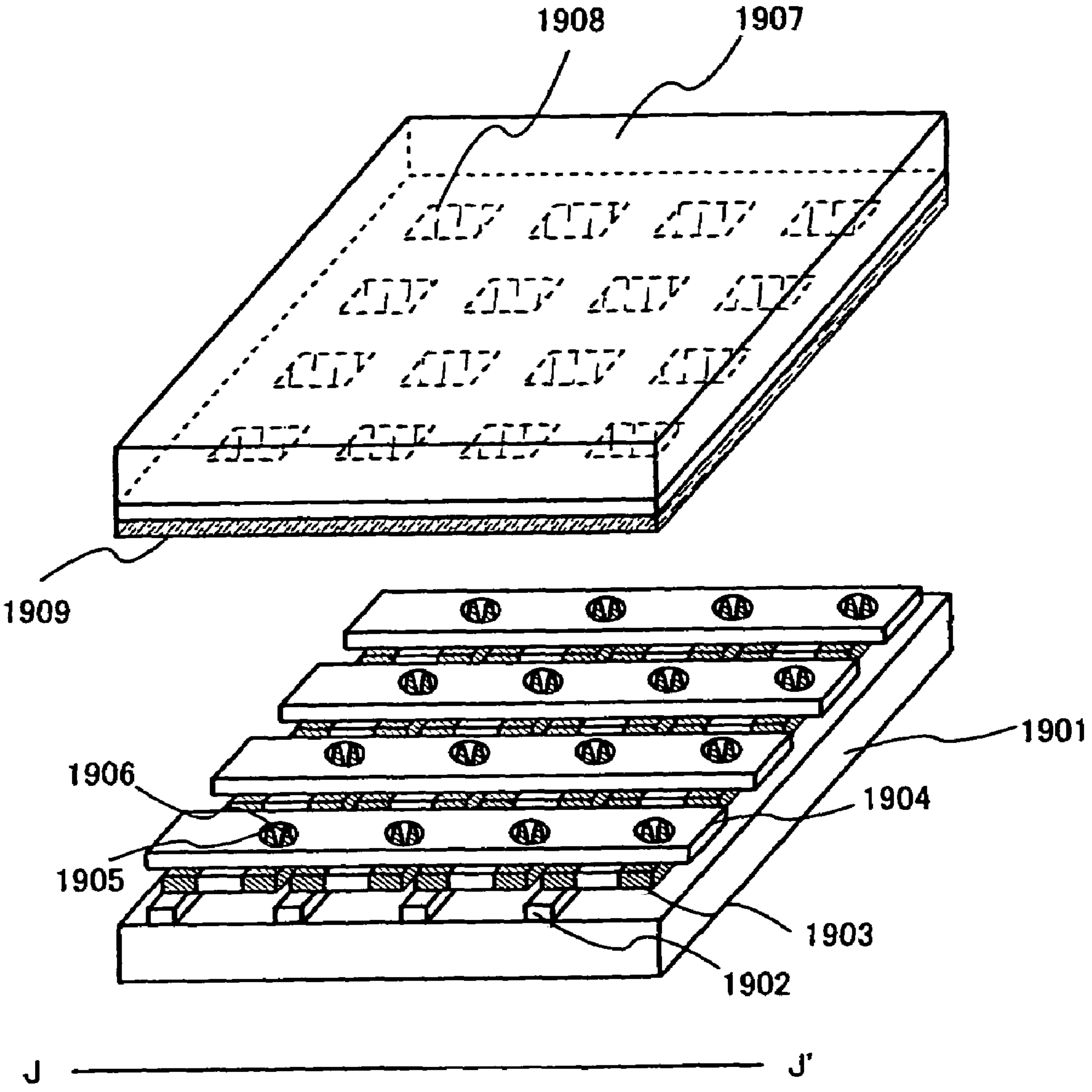
FIG. 23 is a perspective view showing a display panel of a field emission display device according to Embodiment Mode 13 of the present invention.

As shown in FIG. 23, a phosphor layer 1908 and an anode electrode 1909 are formed on a second substrate 1907 similarly to Embodiment Mode 4 or 12.

FIGS. 24A to 24E show sectional views along J-J' of FIG. 23. With reference to FIGS. 24A to 24E a manufacturing method of the field emission device according to the present embodiment mode will be shown.

Figure 24A:
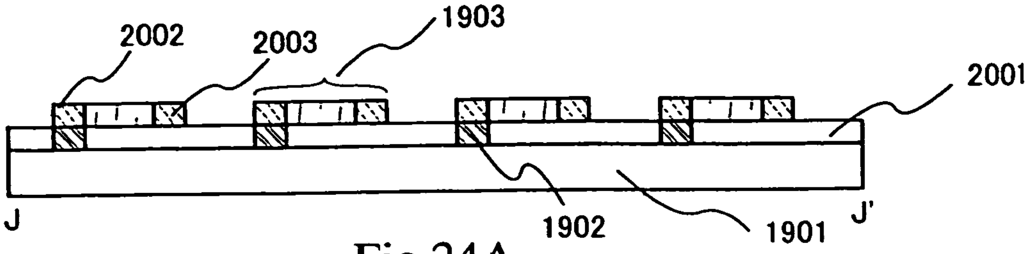
FIGS. 24A to 24E are sectional views showing a manufacturing process of the field emission device according to Embodiment Mode 13 of the present invention.

As shown in FIG. 24A, after forming a first conductive film on the first substrate 1901, a resist mask is used to form the stripe-shaped source wiring 1902. As the first substrate, it is possible to use a glass substrate, a quartz substrate, a sapphire substrate, a semiconductor substrate that has an insulating film formed on the surface thereof, and a metal substrate that has an insulating film formed on the surface thereof. Although the substrate has any size, it is possible to use a large-sized substrate such as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm.

Then, after forming a first insulating film, polishing of the first insulating film is performed with a method such as CMP to expose the source wiring with planarization, and an insulating film 2001 is formed between the source wirings. On the insulating film 2001 and the source wiring 1902, an amorphous semiconductor film is formed with a known method such as CVD or PVD. After that, the amorphous semiconductor film is crystallized with a known method and is subjected to etching to form a crystalline semiconductor film 1903 in the desired shape. Before forming the source wiring on the first substrate, an insulating film may be formed for blocking a slight amount of alkali metal such as sodium (Na), which is included in a glass substrate.

Next, after forming a resist mask (not shown in the figure) on the semiconductor film 1903, doping with an impurity element that imparts n-type is conducted to form the source region 2002 and the drain region 2003. As the impurity element that imparts n-type, it is possible use to an element belonging to Group 15 of the periodic table, typically, phosphorous (P) or arsenic (As).

Figure 24B:
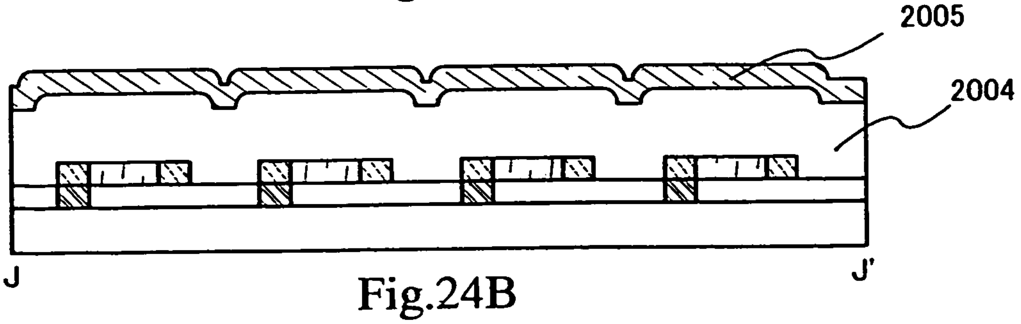

Next, as shown in FIG. 24B, a second insulating film 2004 is formed on the semiconductor film and the first insulating film. As a material of the second insulating film 2004, the materials in Embodiment mode 12 can be used.

Next, a second conductive film 2005 is formed. As a material of the second conductive film, it is possible to use the same material as the conductive film (the conductive film 1706 in FIG. 22B) in Embodiment Mode 11. After forming a resist mask on a conductive film, patterning is conducted to remove an unnecessary portion of the conductive film to form the second conductive film 2005 intersecting with the source wiring through the semiconductor film and the second insulating film 2004.

Figure 24C:
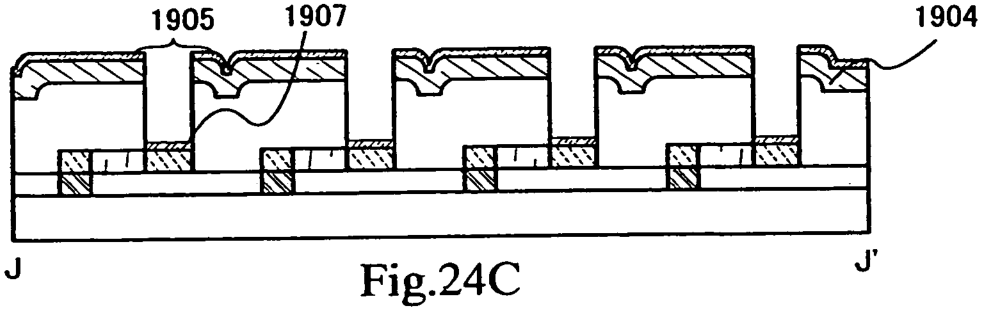

Next, as shown in FIG. 24C, the second conductive film and the second insulating film that are formed on the drain region 2003 are etched to expose a portion of the semiconductor film so that a gate electrode 1904 is formed as well as an opening portion 1905.

Figure 24D:
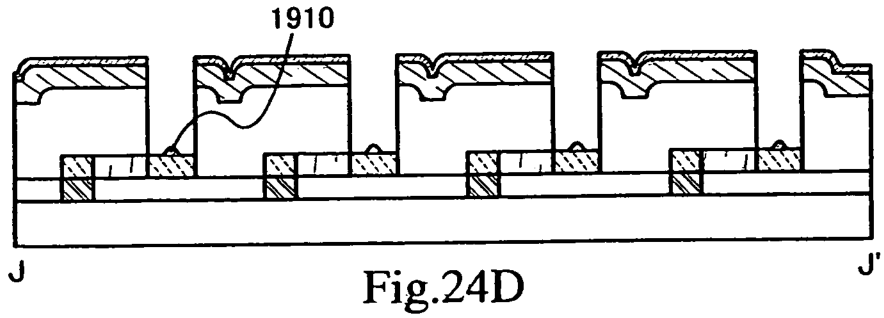

Next, heating is conducted after a thin film 1907 including a metal element of Au, Al, Li, Mg, Ni, Co, Pt, and Fe, which has a thickness from 2 to 5 nm, is formed on the surface of the crystalline semiconductor film at the opening portion 1905 and on the second conductive film. This process makes the semiconductor element and the metal element melt and the metal element or metal silicide 1910 separate out at a grain boundary (triple point) (FIG. 24D).

Figure 24E:
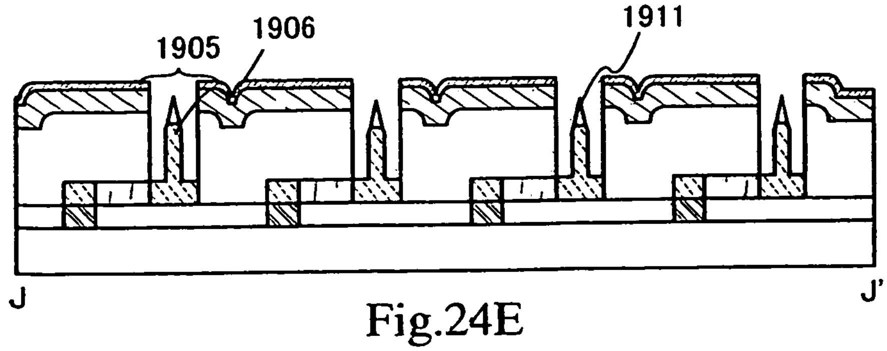

Next, after hydrogenation of the surface of the crystalline semiconductor film and the metal element or metal silicide separated out at the grain boundary, gas including a semiconductor element is used to form the whiskers-shaped electron emission portion with thermal CVD or plasma CVD, as shown in FIG. 24E. In the present embodiment mode, heating at a temperature from 400 to 600° C. in an atmosphere including silane gas of 0.1% is performed to react the metal element or metal silicide with the semiconductor element in the gas phase, and the whiskers-shaped crystalline semiconductor film 1906 is formed. There is an aggregation 1911 of the metal element in a tip of the electron emission portion.

According to the processes mentioned above, it is possible to form the field emission device on the first substrate. In order to more precisely control switching of ON/OFF of the field emission device, a switching element such as a thin film transistor or a diode may additionally be provided in each field emission device. Besides, the gate electrode has a comb shape as Embodiment Mode 5.

The first substrate formed according to the present embodiment mode and the second substrate formed according to a similar process to Embodiment Mode 11 are bonded with a sealing member, and the pressure in a portion surrounded by the first and second substrate and the sealing member is reduced to form a display panel of the field emission display device.

After that, the field emission display device is formed according to a similar process to Embodiment Mode 5.

According to the present embodiment mode, it is possible to form a field emission device on a large-sized substrate without complicated processes. In addition, it becomes possible to control a density of an electron emission portion formed at a grain boundary since the grain boundary can be controlled with conditions in crystallizing a semiconductor film. Furthermore, a field emission display device according to the present embodiment mode has an electron emission portion formed in a drain region of a switching element in each pixel. Accordingly, it is possible to form a display device with high resolution since electron emission can be controlled in each pixel.

Embodiment Mode 14

An explanation will be given with reference to FIG. 25 and FIGS. 26A to 26E on a field emission device of a triode-type FED and a field emission display device including the field emission device. The field emission device to be mentioned here includes 1) an etched semiconductor region into a desired shape, which includes source and drain regions, 2) a source electrode which has contact with the source region of the semiconductor film, 3) a gate electrode (a gate wiring) which controls the carrier concentration between the source and drain regions through an insulating film, and 4) an electron emission portion in the shape of whiskers formed at a surface of the drain region of the semiconductor film in an opening portion of the gate electrode and the insulating film.

Figure 25:
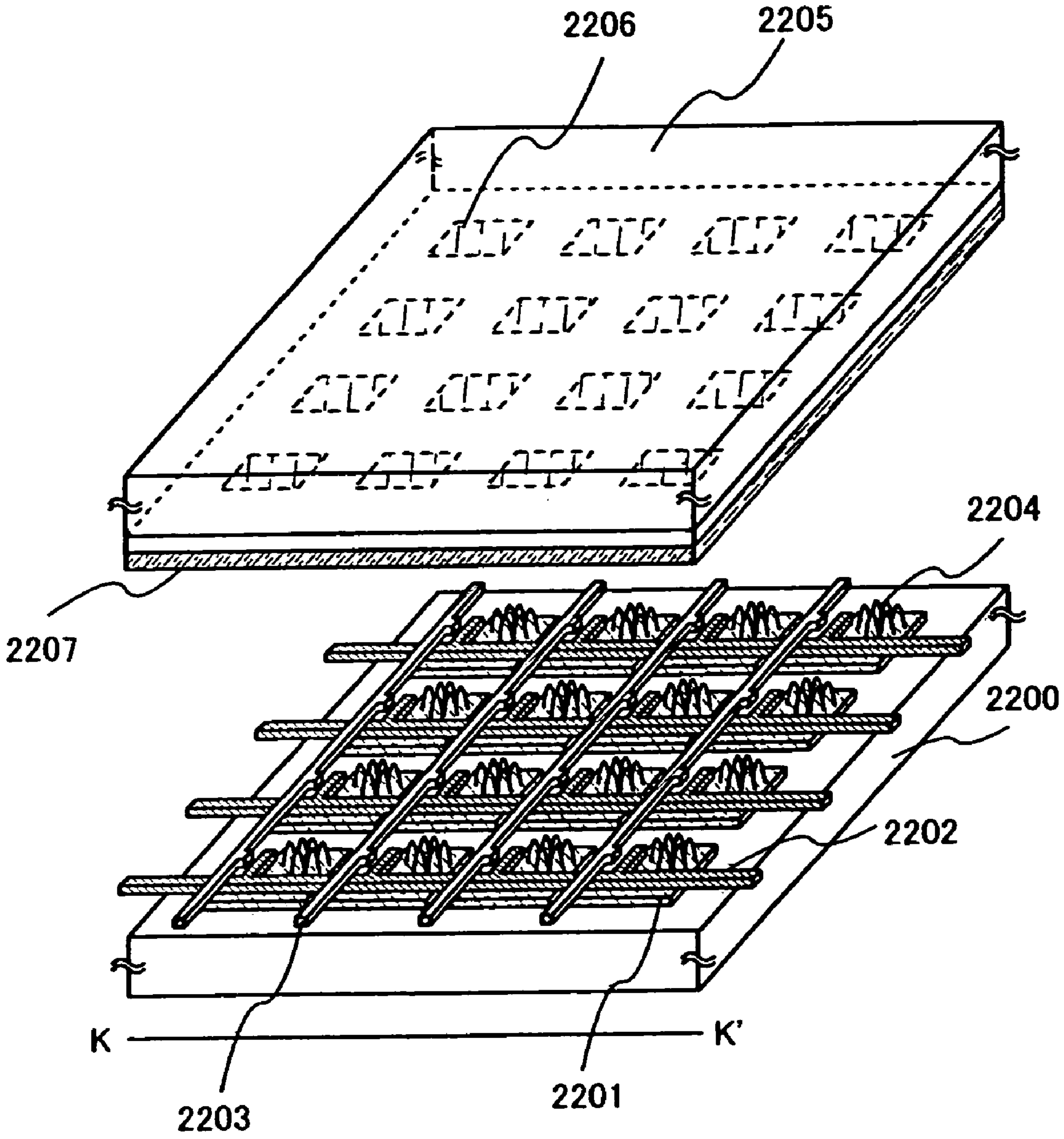
FIG. 25 is a perspective view showing a display panel of a field emission display device according to Embodiment Mode 14 of the present invention.

As shown in FIG. 25, a phosphor layer 2206 and an anode electrode 2207 are formed on a second substrate 2205 similarly to Embodiment Mode 4 or 12.

FIGS. 26A to 26E show sectional views along K-K' of FIG. 25. With reference to FIGS. 26A to 26E, a manufacturing method of the field emission device according to the present embodiment mode will be shown.

Figure 26A:
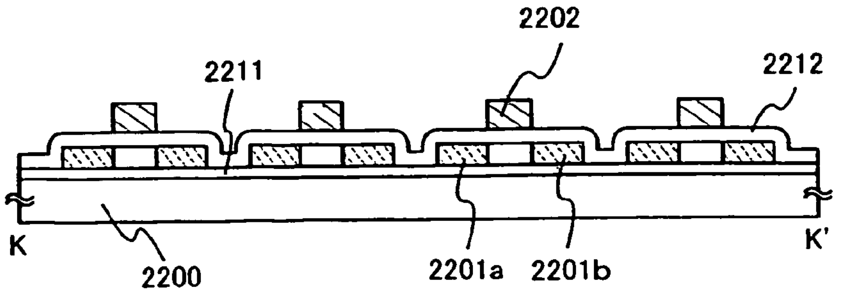
FIGS. 26A to 26E are sectional views showing a manufacturing process of the field emission device according to Embodiment Mode 14 of the present invention.

As shown in FIG. 26A, a first insulating film 2211 is formed on a first substrate 2200. Then, the known method, as shown in Embodiment Mode 1, is used to form a crystalline semiconductor film, and a portion of the crystalline semiconductor film is subjected to etching to form a semiconductor region (a region 2201 in FIG. 25) in the desired shape.

Next, a second insulating film 2212 is formed with a known method. As the second insulating film 2212, a film containing silicon and oxygen as its main components such as a silicon oxide film, a silicon oxynitride film, or a silicon oxynitride film (different composition ratio) is formed.

Next, a first conductive film is formed. As the first conductive film, it is possible to form a film including the same metal element as the conductive film 603 in Embodiment Mode 4. Then, after forming a resist mask on the first conductive film, patterning is conducted to remove an unnecessary portion of the first conductive film to form a gate electrode 2202. After that, with the use of the gate electrode 2202 as a mask, a portion of the crystalline semiconductor film is doped with an impurity that imparts n-type to form source and drain regions 2201_a_ and 2201_b_.

Figure 26B:
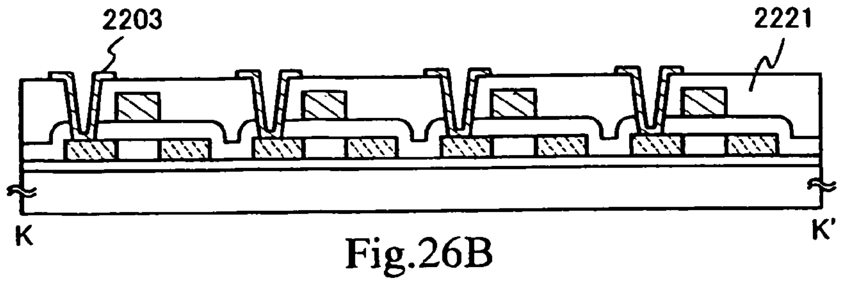

Next, as shown in FIG. 26B, a third insulating film 2221 is formed. It is possible to form the third insulating film 2221 with the use of the same material as the second insulating film 602 shown in Embodiment Mode 4.

Next, a portion of the second and third insulating films is subjected to etching, and a second conductive film is deposited. Then, the second conductive film is etched into a desired shape to form a source electrode 2203.

Figure 26C:
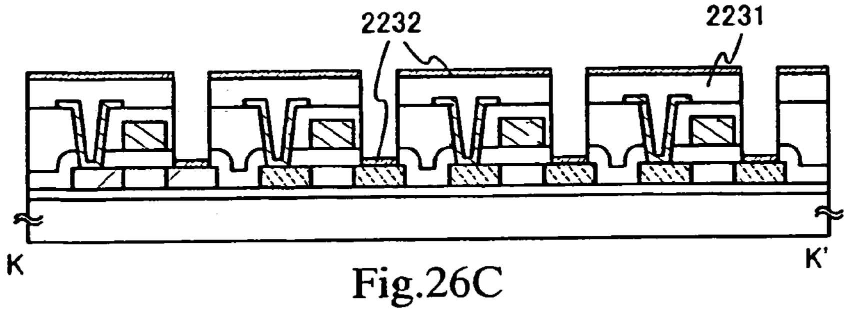
Figure 26D:
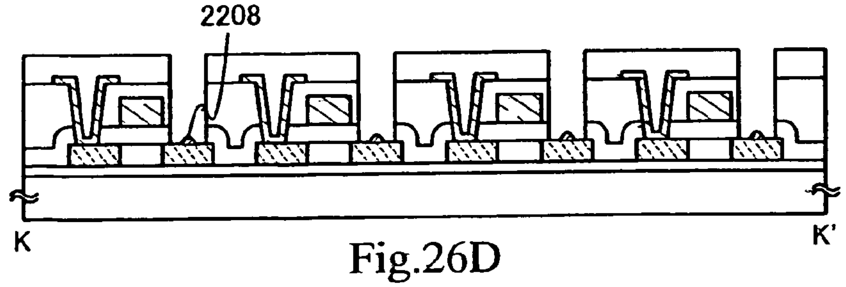

Next, as shown in FIG. 26C, after forming a fourth insulating film 2231 on the third insulating film 2221, a portion of the second to fourth insulating films is etched to expose a portion of the semiconductor region. After that, a known method such as CVD or PVD is used to form a thin film 2232 on the substrate, which includes a metal element and has a film thickness from 2 to 5 nm. As the metal element, nickel (Ni), iron (Fe), cobalt (Co), platinum (Pt), titanium (Ti), and palladium (Pd), for example, can be used. In the present embodiment mode, a thin film including gold is deposited.

Next, it makes the metal element or metal silicide 2208 separate out at a grain boundary (triple point) (FIG. 26D) to heat at a temperature from 100 to 1100° C., preferably from 400 to 650° C., for 1 to 5 hours.

Figure 26E:
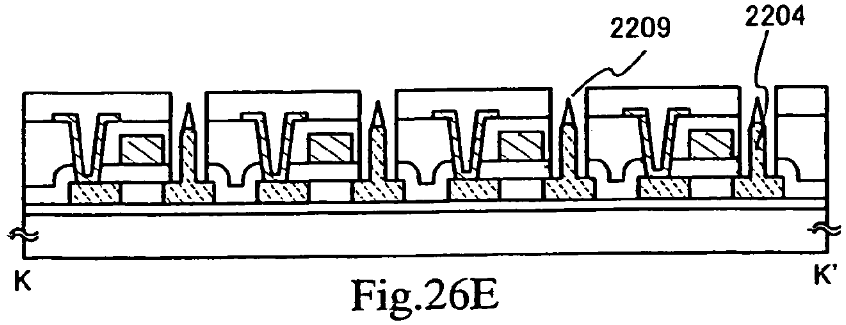

Next, after hydrogenation of the surface of the crystalline semiconductor film and the metal element or metal silicide separated out at the grain boundary, gas including a semiconductor element is used to form the whiskers-shaped electron emission portion with thermal CVD or plasma CVD, as shown in FIG. 26E. In the present embodiment mode, heating at a temperature from 400 to 600° C. in an atmosphere including silane gas of 0.1% is performed to react the metal element or metal silicide with the semiconductor element in the gas phase, and the whiskers-shaped crystalline semiconductor film 2204 is formed. There is an aggregation 2209 of the metal element in a tip of the electron emission portion.

In FIG. 25, the first to fourth insulating films 2211, 2212, 2221, and 2231, which are shown in FIG. 26A to 12E, are omitted.

In order to more precisely control switching of ON/OFF of the field emission device, a switching element such as a thin film transistor or a diode may additionally be provided in each field emission device. Besides, a control electrode for controlling an amount of electron may be provided on the insulating film such as on the third insulating film 2221 or the fourth insulating film 2231. With the structure, it is possible to control electron emission with more stability.

Although the field emission device has a top-gate structure in the present embodiment mode, there is no limitation, and it is possible to apply a bottom-gate structure to form a field emission device similarly.

The first substrate formed according to the processes mentioned above and the second substrate are bonded with a sealing member, and the pressure in a portion surrounded by the first and second substrate and the sealing member is reduced to form a display panel of the field emission display device.

After that, the field emission display device is formed according to a similar process to Embodiment Mode 5.

According to the present embodiment mode, it is possible to form a field emission device on a large-sized substrate without complicated processes. In addition, it becomes possible to control a density of an electron emission portion formed at a grain boundary since the grain boundary can be controlled with conditions in crystallizing a semiconductor film. Furthermore, a field emission display device according to the present embodiment mode has an electron emission portion formed in a drain region of a switching element in each pixel. Accordingly, it is possible to form a display device with high resolution since electron emission can be controlled in each pixel.

EMBODIMENTS

Embodiment 1

In the present embodiment, a process for forming a field emission device that has a conical electron emission portion according to Embodiment Mode 2 will be described with reference to FIGS. 3A to 3C.

First, an insulating film 201 is formed on a substrate 200. Here, the first insulating film 201 is formed of a laminated structure of a first silicon oxynitride film (film thickness: 50 nm) containing nitrogen more than or nearly equal to oxygen, which is deposited with plasma CVD using $SiH_4$, $NH_3$, and $N_2O$ as reaction gas, and a second silicon oxynitride film (film thickness: 100 nm) containing oxygen more than nitrogen, which is deposited with plasma CVD using $SiH_4$ and $N_2O$ as reaction gas.

Next, low-pressure CVD is used to form an amorphous silicon film with a film thickness of 50 nm as a semiconductor film. Then, the amorphous silicon film is doped with an impurity element that imparts n-type in order to enhance conductivity of the amorphous silicon film. Here, phosphorous (P) at $1\times10^{20}/cm^3$ is used as the impurity element that imparts n-type to form an n-type amorphous silicon film 301.

Next, after forming a resist mask 302 on a portion to form a cathode electrode, etching is performed to remove an unnecessary portion and form a stripe-shaped amorphous silicon film 202. Then, heat at 500° C. for 1 hour in a nitrogen atmosphere is conducted to perform dehydrogenation of the amorphous silicon film.

Next, after removing an oxide film formed on the surface due to the thermal treatment, a laser beam is irradiated to form a convex portion at the amorphous silicon film. In the present embodiment, a pulse oscillation XeCl laser beam is used as the laser beam and the laser beam is irradiated to the amorphous silicon film under conditions of an energy density of 485 $mJ/cm^2$, a frequency of 30 Hz, and an irradiated pulse frequency of 60 times. Hereby, a cone that has a basal plane with a diameter from 80 to 200 μm and a height (a vertical interval between the basal plane and an apex of the cone) from 250 to 350 nm is formed all over a crystalline silicon film with a density of $10/\mu m^2$.

According to the processes above, it is possible to form the conical electron emission portion.

Embodiment 2

In the present embodiment, a process for forming a field emission device that has a conical electron emission portion according to Embodiment Mode 4 will be described with reference to FIGS. 6A to 6D.

First, a first insulating film 601 is formed on a substrate 501. The first insulating film 601 can be formed similarly to Embodiment 1.

Next, low-pressure CVD is used to form an amorphous silicon film with a film thickness of 50 nm. After that, the amorphous silicon film is crystallized to form a crystalline silicon film. In the present embodiment, a metal element for promoting crystallization is added to a whole surface of the amorphous silicon film, and heat treatment is conducted. Here, nickel is used as the metal element for promoting crystallization, and solution containing nickel of 5 ppm is applied. Then, heating at 500° C. for 1 hour is conducted to perform dehydrogenation of the amorphous silicon film. After that, rapid thermal annealing (hereinafter, referred to as RTA) that uses a lump as a light source or RTA that uses heated gas (gas RTA) is used to perform RTA at a predetermined heating temperature of 740° C. for 180 seconds to form a crystalline silicon film. Then, the metal element added to the crystalline silicon film is removed.

Next, the crystalline silicon film is doped with an impurity element that imparts n-type in order to enhance conductivity of the crystalline silicon film. Here, phosphorous (P) at $1\times10^{20}/cm^3$ is used as the impurity element that imparts n-type to form an n-type crystalline silicon film.

Next, after forming a resist mask (not shown in the figure) on a portion to form a cathode electrode, etching is performed to remove an unnecessary portion and form a stripe-shaped crystalline silicon film 502.

Next, after using low-pressure CVD to form a second insulating film 602 to become a gate insulating film, a conductive film 603 is deposited for forming a gate electrode. In the present embodiment, a silicon oxide film is formed as the second insulating film 602 and a film including a metal element of tungsten is formed as the conductive film 603. After that, dry etching is performed to form an opening portion 507 as well as a stripe-shaped gate electrode 503.

Next, a laser beam 610 is irradiated to form a convex portion at the crystalline silicon film. In the present embodiment, a pulse oscillation XeCl laser beam is used as the laser beam and the laser beam is irradiated to the crystalline silicon film under conditions of an energy density of 485 $mJ/cm^2$, a frequency of 30 Hz, and an irradiated pulse frequency of 60 times. Hereby, a cone that has a basal plane with a diameter from 80 to 200 μm and a height from 250 to 350 mm is formed all over the crystalline silicon film.

After that, the second insulating film is subjected to isotropic etching to expose an end of the opening (an open end) of the gate electrode.

According to the processes above, it is possible to form the conical electron emission portion.

According to the present invention, it is possible to form a field emission device without complicated processes in a manufacturing process of the field emission device of a field emission display device, and lot-to-lot variation can be avoided. Namely, it is possible to improve productivity. In addition, since it is also possible without complicated processes to form a field emission device with the use of an inexpensive large-sized substrate, and reduction in cost becomes possible. Furthermore, it becomes possible to control a density of an electron emission portion formed at a grain boundary since the grain boundary can be controlled with conditions in crystallizing a semiconductor film.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a field emission device comprising:
- forming a semiconductor film in the shape of a stripe over an insulating surface of a substrate;
- forming an insulating film on the semiconductor film and the insulating surface;
- forming a gate electrode in the shape of a stripe on the insulating film;
- removing a portion of the gate electrode and a portion of the insulating film to expose the semiconductor film; and
- irradiating a laser beam to the semiconductor film to form a conical convex portion.

2. A method according to claim 1, wherein the semiconductor film is doped with an impurity that imparts n-type.

3. A method according to claim 1, wherein the laser beam is a pulse oscillation laser beam.

4. A method according to claim 1, wherein an electron emission portion comprises the conical convex portion.

5. A method for manufacturing a field emission device comprising:
- forming a first conductive film in the shape of a stripe over an insulating surface of a substrate;
- forming a first insulating film on the insulating surface;
- forming a semiconductor film on the first conductive film and the first insulating film;
- processing the semiconductor film into a desired shape;
- forming a second insulating film on the semiconductor film in the desired shape;
- forming a second conductive film on the second insulating film;
- removing a portion of the second conductive film and a portion of the second insulating film to expose the semiconductor film; and
- irradiating a laser beam to the semiconductor film to form a conical convex portion.

6. A method according to claim 5, wherein the semiconductor film is etched into the desired shape and a portion of the semiconductor film in the desired shape is doped with an impurity that imparts n-type.

7. A method according to claim 5, wherein the laser beam is a pulse oscillation laser beam.

8. A method according to claim 5, wherein an electron emission portion comprises the conical convex portion.

9. A method for manufacturing a field emission device comprising:
- forming a semiconductor film over an insulating surface of a substrate;
- processing the semiconductor film into a desired shape;
- forming a first insulating film on the semiconductor film in the desired shape;
- forming a first conductive film on the first insulating film;
- forming a second insulating film on the first conductive film and the first insulating film;
- removing a portion of the first insulating film and a portion of the second insulating film to expose first and second portions of the semiconductor film;
- forming a second conductive film to have contact with the first portion; and
- irradiating a laser beam to the semiconductor film to form a conical convex portion in the second portion.

10. A method according to claim 9, wherein the semiconductor film is etched into the desired shape and a portion of the semiconductor film in the desired shape is doped with an impurity that imparts n-type.

11. A method according to claim 9, wherein the laser beam is a pulse oscillation laser beam.

12. A method according to claim 9, wherein an electron emission portion comprises the conical convex portion.

13. A method for manufacturing a field emission device comprising:
- forming a semiconductor film over an insulating surface of a substrate;
- adding a metal element to the semiconductor film;
- performing a first process to crystallize the semiconductor film and segregate the metal element or metal suicide at a grain boundary of the crystallized semiconductor film; and
- performing a second process in an atmosphere including gas including a semiconductor element to form a whiskers-shaped convex portion in the vicinity of a surface of the metal element or the metal silicide.

14. A method according to claim 13, wherein the metal element is added with one of application, PVD, and CVD.

15. A method according to claim 13, wherein the first process is one of heating at a temperature from 300 to 650° C. and irradiation of a laser beam.

16. A method according to claim 13, wherein the gas including the semiconductor element includes one of silane and poly-silane such as di-silane or tri-silane.

17. A method according to claim 13, wherein the second process is heat treatment at a temperature from 400 to 650° C.

18. A method according to claim 13, wherein the semiconductor film is doped with an impurity that imparts n-type.

19. A method according to claim 13, wherein the metal element is one of Au, Al, Li, Mg, Ni, Co, Pt, and Fe.

20. A method according to claim 13, wherein an electron emission portion comprises the whiskers-shaped conical convex portion.

* * * * *